(12) United States Patent
Kanzawa et al.

(10) Patent No.: US 9,142,292 B2
(45) Date of Patent: *Sep. 22, 2015

(54) METHOD FOR READING DATA FROM NONVOLATILE STORAGE ELEMENT, AND NONVOLATILE STORAGE DEVICE

(75) Inventors: Yoshihiko Kanzawa, Osaka (JP); Takeshi Takagi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 72 days.

This patent is subject to a terminal disclaimer.

(21) Appl. No.: 13/982,280

(22) PCT Filed: Jan. 31, 2012

(86) PCT No.: PCT/JP2012/000608
§ 371 (c)(1),
(2), (4) Date: Jul. 29, 2013

(87) PCT Pub. No.: WO2012/105232
PCT Pub. Date: Aug. 9, 2012

(65) Prior Publication Data
US 2013/0308371 A1 Nov. 21, 2013

(30) Foreign Application Priority Data
Feb. 2, 2011 (JP) ................................ 2011-021135

(51) Int. Cl.
*G11C 11/00* (2006.01)
*G11C 13/00* (2006.01)
(Continued)

(52) U.S. Cl.
CPC .......... *G11C 13/004* (2013.01); *G11C 13/0007* (2013.01); *G11C 2013/0054* (2013.01);
(Continued)

(58) Field of Classification Search
CPC ............. G11C 13/004; G11C 13/0007; H01L 27/2409; H01L 45/08
USPC ..................... 365/148, 189.07, 196
See application file for complete search history.

(56) References Cited

U.S. PATENT DOCUMENTS 7,235,407 B2   6/2007  Li et al.
7,495,984 B2 *  2/2009  Kim et al. .................. 365/210.1
(Continued)

FOREIGN PATENT DOCUMENTS

JP   2005-340806   12/2005
JP   2006-140464   6/2006
(Continued)

OTHER PUBLICATIONS
International Search Report issued Mar. 6, 2012 in International (PCT) Application No. PCT/JP2012/000608.
(Continued)

*Primary Examiner* — Viet Q Nguyen
(74) *Attorney, Agent, or Firm* — Wenderoth, Lind & Ponack, L.L.P.

(57) ABSTRACT

Provided is a method for reading data from a variable resistance nonvolatile storage element, where the operation for reading data is less susceptible to a fluctuation phenomenon of resistance values in reading the data. The method includes: detecting a current value $I_{read}$ that flows through the nonvolatile storage element that can be in a low resistance state RL and a high resistance state RH, with application of a fixed voltage; and determining that (i) the nonvolatile storage element is in a high resistance state when the current value $I_{read}$ detected in the detecting is smaller than a current reference level Iref, and (ii) the nonvolatile storage element is in a low resistance state when the current value $I_{read}$ detected in the detecting is larger than the reference level Iref, the current reference level Iref being defined by (IRL+IRH)/2<Iref<IRL.

16 Claims, 15 Drawing Sheets

(51) Int. Cl.
  *H01L 27/24* (2006.01)
  *H01L 45/00* (2006.01)

(52) U.S. Cl.
  CPC ......... *H01L27/2409* (2013.01); *H01L 27/2418* (2013.01); *H01L 27/2436* (2013.01); *H01L 45/08* (2013.01); *H01L 45/1233* (2013.01); *H01L 45/146* (2013.01); *H01L 45/1625* (2013.01)

(56) References Cited

U.S. PATENT DOCUMENTS

| | | | |
|---|---|---|---|
| 7,535,035 | B2 | 5/2009 | Baek et al. |
| 7,696,550 | B2 | 4/2010 | Li et al. |
| 7,835,210 | B2 * | 11/2010 | Shimizu .................. 365/210.15 |
| 8,023,311 | B2 | 9/2011 | Kim et al. |
| 8,227,788 | B2 | 7/2012 | Mikawa et al. |
| 8,345,467 | B2 | 1/2013 | Kim et al. |
| 8,399,875 | B1 | 3/2013 | Mikawa et al. |
| 8,861,253 | B2 * | 10/2014 | Chang et al. .................. 365/148 |
| 2005/0275064 | A1 | 12/2005 | Li et al. |
| 2006/0097288 | A1 | 5/2006 | Baek et al. |
| 2007/0140029 | A1 | 6/2007 | Kim et al. |
| 2007/0221975 | A1 | 9/2007 | Li et al. |
| 2009/0135642 | A1 | 5/2009 | Kim et al. |
| 2009/0224224 | A1 | 9/2009 | Fujii et al. |
| 2010/0295012 | A1 | 11/2010 | Mikawa et al. |
| 2011/0310657 | A1 | 12/2011 | Kim et al. |
| 2013/0056701 | A1 | 3/2013 | Mikawa et al. |
| 2014/0036572 | A1 * | 2/2014 | Takagi et al. .................. 365/148 |

FOREIGN PATENT DOCUMENTS

| | | |
|---|---|---|
| JP | 2006-146983 | 6/2006 |
| JP | 2007-164969 | 6/2007 |
| JP | 2008-065953 | 3/2008 |
| JP | 2009-021524 | 1/2009 |
| JP | 4203532 | 1/2009 |
| WO | 2008/059701 | 5/2008 |
| WO | 2010/058569 | 5/2010 |

OTHER PUBLICATIONS

Daniele Ielmini et al., "Resistance-dependent amplitude of random telegraph-signal noise in resistive switching memories", Applied Physics Letters, vol. 96, No. 5, Feb. 2010, p. 053503-1-053503-3.

* cited by examiner

METHOD FOR READING DATA FROM NONVOLATILE STORAGE ELEMENT, AND NONVOLATILE STORAGE DEVICE

TECHNICAL FIELD

The present invention relates to a method for reading data from a variable resistance nonvolatile storage element in which a resistance value changes according to an electrical signal to be applied, and to a nonvolatile storage device.

BACKGROUND ART

With the development in digital technologies in recent years, electronic devices such as mobile information equipment and information home appliances have higher functionality. Thus, demands for increasing the capacity of nonvolatile storage elements included in these devices, reducing the write power, accelerating writing and reading operations, and increasing the life span of these devices have been increasing.

To meet such demands, miniaturization of flash memories including existing floating gates is said to have limitations. Thus, attention is recently focused on a new variable resistance nonvolatile storage element including a variable resistance layer as a material of a storage unit.

The variable resistance nonvolatile storage element has a very simple structure including a variable resistance layer that is disposed between a lower electrode and an upper electrode. A resistance state of the nonvolatile storage element changes between a low resistance state and a high resistance state only with application, between the lower electrode and the upper electrode, of a predetermined electric pulse having a voltage higher than or equal to a threshold. Then, information is recorded in association with these different resistance states and its values. Since the variable resistance nonvolatile storage element (also referred to as "variable resistance element") has such a simple structure and simply performs operations, it is expected that the nonvolatile storage element can further be miniaturized and the cost can be reduced. Since the resistance state of the variable resistance nonvolatile storage element sometimes changes between the low resistance state and the high resistance state by orders of magnitude not longer than 100 nanoseconds (ns), the attention is further focused on the variable resistance nonvolatile storage elements in view of its higher operating speed, and various proposals of these have been made.

In particular in recent years, there are many proposals for variable resistance nonvolatile storage elements comprising metal oxides in the variable resistance layers. Such variable resistance nonvolatile storage elements comprising metal oxides can be largely divided into two types, depending on a material to be used in each of the variable resistance layers.

One type is the variable resistance nonvolatile storage elements comprising perovskite materials ($Pr_{(1-x)}Ca_xMnO_3$ [PCMO], $LaSrMnO_3$ [LSMO], and $GdBaCo_xO_y$ [GBCO], for example) in the variable resistance layers, as disclosed in PTL 1 and others.

The other is the variable resistance nonvolatile storage elements that are compounds comprising only transition metals and oxygen, using binary transition metal oxides. Compared to the perovskite materials, the binary transition metal oxides have very simple composition structures. Thus, controlling the compositions when manufactured and in forming the films are relatively easy. In addition, with the advantage of relatively favorable compatibility with semiconductor manufacturing processes, the variable resistance nonvolatile storage elements have intensely been studied in recent years. For example, PTL 2 discloses variable resistance elements comprising, as variable resistance materials, (i) transition metal oxides of stoichiometric composition, such as nickel (Ni), niobium (Nb), titanium (Ti), zirconium (Zr), hafnium (Hf), cobalt (Co), iron (Fe), copper (Cu), and chrome (Cr), and (ii) oxides whose composition is deficient in oxygen compared to its stoichiometric composition (hereinafter referred to as oxygen-deficient oxides). Furthermore, PTL 3 discloses a nonvolatile storage element comprising an oxygen-deficient tantalum (Ta) oxide as a variable resistance material. When a Ta oxide layer is denoted as $TaO_x$, PTL 3 reports a resistance change phenomenon in a range satisfying $0.8 \leq x \leq 1.9$ (from 44.4 to 65.5% in terms of oxygen concentration).

Furthermore, PTL 3 also reports that a variable resistance nonvolatile storage element has two different operation modes, namely, unipolar (monopolar) switching and bipolar switching.

The unipolar switching is an operation mode in which a resistance value changes with application of electric pulses having the same polarity and different amplitudes between a lower electrode and an upper electrode of a variable resistance nonvolatile storage element, which is disclosed by PTL 2 and others. Furthermore, the unipolar switching requires changing not only the magnitude of the voltage but also the length (pulse width) of the electric pulse simultaneously, as disclosed by PTL 4 in detail. For example, the unipolar switching requires using two types of electric pulses, that is, a nanosecond pulse and a microsecond pulse.

In contrast, the bipolar switching is an operation mode in which a resistance value changes with application of electric pulses of positive and negative polarities between a lower electrode and an upper electrode of a variable resistance nonvolatile storage element, which is disclosed by PTLs 1 and 2. As disclosed by PTL 4, electric pulses of a nonvolatile storage element that performs the bipolar switching are generally set to the same length of order of nanoseconds.

CITATION LIST

Patent Literature

[PTL 1] Japanese Unexamined Patent Application Publication No. 2005-340806
[PTL 2] Japanese Unexamined Patent Application Publication No. 2006-140464
[PTL 3] International Publication WO2008/059701
[PTL 4] Japanese Patent No. 4203532

SUMMARY OF INVENTION

Technical Problem

As the name suggests, the nonvolatile storage element is an element having characteristics of holding information without volatilizing (losing, deteriorating, and changing) the information, after the information is electrically stored thereon and even when the power is turned off. Thus, one of the important characteristics necessary for the nonvolatile storage element is higher holding capability of information. In other words, the nonvolatile storage element needs to have capability of storing information without deteriorating the information once written therein. Thus, the higher information holding capability is desired. Generally, any nonvolatile storage elements cannot avoid a situation where storage information changes within a finite length of time.

The phenomena in which information once stored gradually changes with the passage of time include a phenomenon in which the resistance value of a nonvolatile storage element changes in a long period of time (for example, over 100 hours), and a phenomenon in which the resistance value of a nonvolatile storage element changes in a short period of time (for example, within several minutes) (this phenomenon is referred to as "fluctuation"). In particular, any methods for effectively suppressing the "fluctuation" phenomenon in which the resistance value of a nonvolatile storage element changes in a short period of time are not suggested yet.

The present invention has been conceived in view of the above circumstances, and has an object of suggesting a method for reading data that is less susceptible to a fluctuation phenomenon of resistance values in reading the data, and improving the holding capability of information of the nonvolatile storage element.

Solution To Problem

An aspect of the present invention to achieve the object is a method for reading data from a variable resistance nonvolatile storage element (i) including a first electrode, a second electrode, and a variable resistance layer disposed between and in contact with the first electrode and the second electrode and (ii) having characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, the method includes: detecting a current that flows through the nonvolatile storage element with application of a fixed voltage; and determining that (i) the nonvolatile storage element is in a high resistance state when the current detected in the detecting is smaller than a current reference level Iref, and (ii) the nonvolatile storage element is in a low resistance state when the current detected in the detecting is larger than the reference level Iref, the current reference level Iref being defined by (IRL+IRH)/2<Iref<IRL, where IRL denotes a current that flows through the nonvolatile storage element in the first resistance state RL with application of the fixed voltage, IRH denotes a current that flows through the nonvolatile storage element in the second resistance state RH, and IRH<IRL.

Furthermore, another aspect of the present invention is a method for reading data from a variable resistance nonvolatile storage element (i) including a first electrode, a second electrode, and a variable resistance layer disposed between and in contact with the first electrode and the second electrode and (ii) having characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, the method includes: detecting a resistance value of the nonvolatile storage element; and determining that (i) the nonvolatile storage element is in a low resistance state when the resistance value detected in the detecting is smaller than a resistance reference level Rref, and (ii) the nonvolatile storage element is in a high resistance state when the resistance value detected in the detecting is larger than the resistance reference level Rref, the resistance reference level Rref being defined by RL<Rref<(RL+RH)/2.

Furthermore, another aspect of the present invention to achieve the object is a nonvolatile storage device including: a variable resistance nonvolatile storage element; and a control unit configured to read data from the nonvolatile storage element, wherein the nonvolatile storage element (i) includes a first electrode, a second electrode, and a variable resistance layer disposed between and in contact with the first electrode and the second electrode and (ii) has characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, and the control unit is configured to: detect a current that flows through the nonvolatile storage element with application of a fixed voltage; and determine that (i) the nonvolatile storage element is in a high resistance state when the detected current is smaller than a current reference level Iref, and (ii) the nonvolatile storage element is in a low resistance state when the detected current is larger than the reference level Iref, the current reference level Iref being defined by (IRL+IRH)/2<Iref<IRL, where IRL denotes a current that flows through the nonvolatile storage element in the first resistance state RL with application of the fixed voltage, IRH denotes a current that flows through the nonvolatile storage element in the second resistance state RH, and IRH<IRL.

Furthermore, another aspect of the present invention is a nonvolatile storage device including: a variable resistance nonvolatile storage element; and a control unit configured to read data from the nonvolatile storage element, wherein the nonvolatile storage element (i) includes a first electrode, a second electrode, and a variable resistance layer disposed between and in contact with the first electrode and the second electrode and (ii) has characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, the control unit is configured to: detect a resistance value of the nonvolatile storage element; and determine that (i) the nonvolatile storage element is in a low resistance state when the detected resistance value is smaller than a resistance reference level Rref, and (ii) the nonvolatile storage element is in a high resistance state when the detected resistance value is larger than the resistance reference level Rref, the resistance reference level Rref being defined by RL<Rref<(RL+RH)/2.

Advantageous Effects of Invention

The method for reading data from a nonvolatile storage element and a nonvolatile storage device according to the present invention can reduce the influence of the fluctuations on a set resistance value (variation in resistance value for a short period of time), and consequently, improve the information holding capability of the variable resistance nonvolatile storage element.

Figure 16:
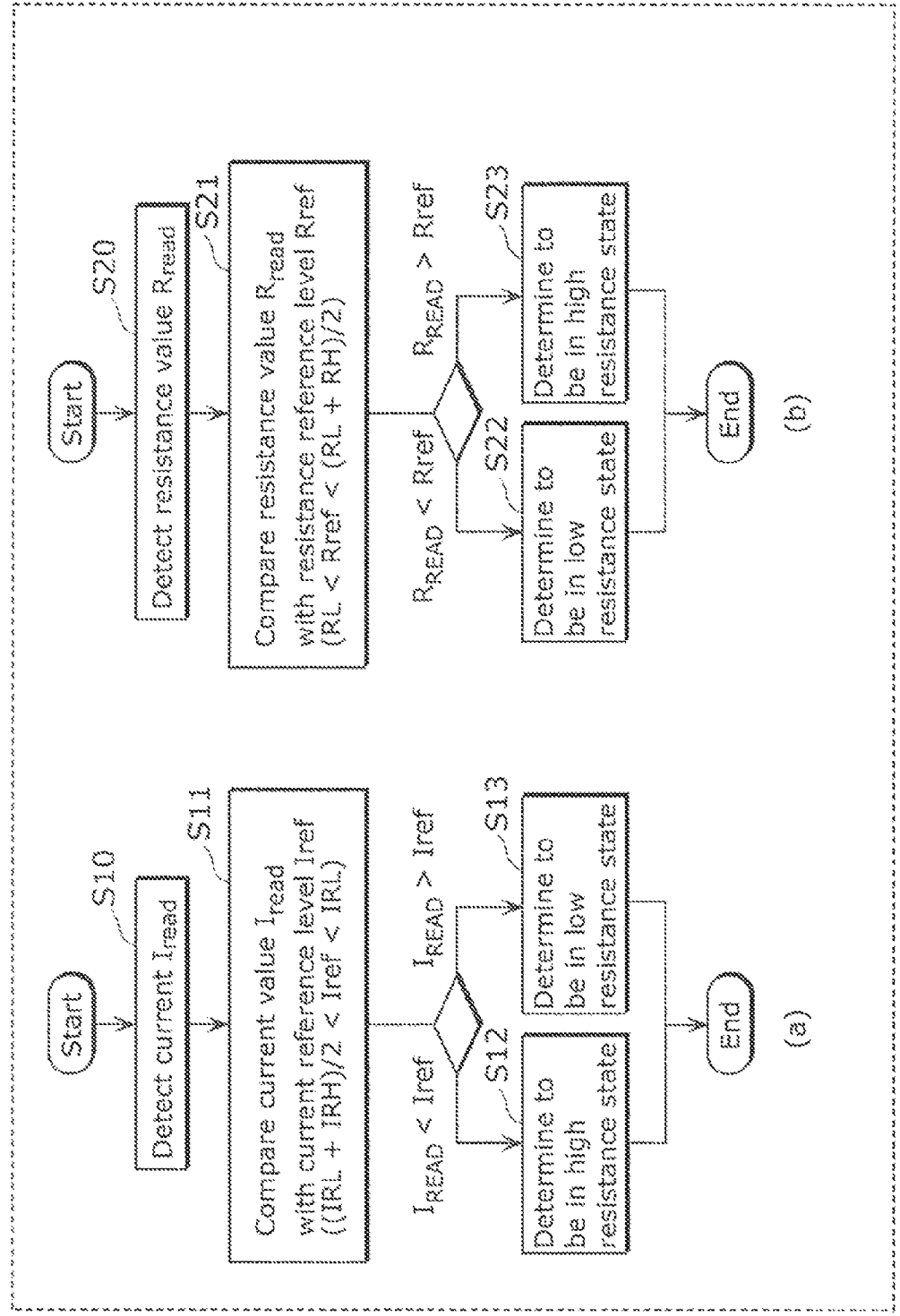

(a) of FIG. 16 is a flow chart showing the main procedure for reading data based on a current value of a nonvolatile storage element, and (b) of FIG. 16 is a flow chart showing the main procedure for reading data based on a resistance value of a nonvolatile storage element.

Figure 17:
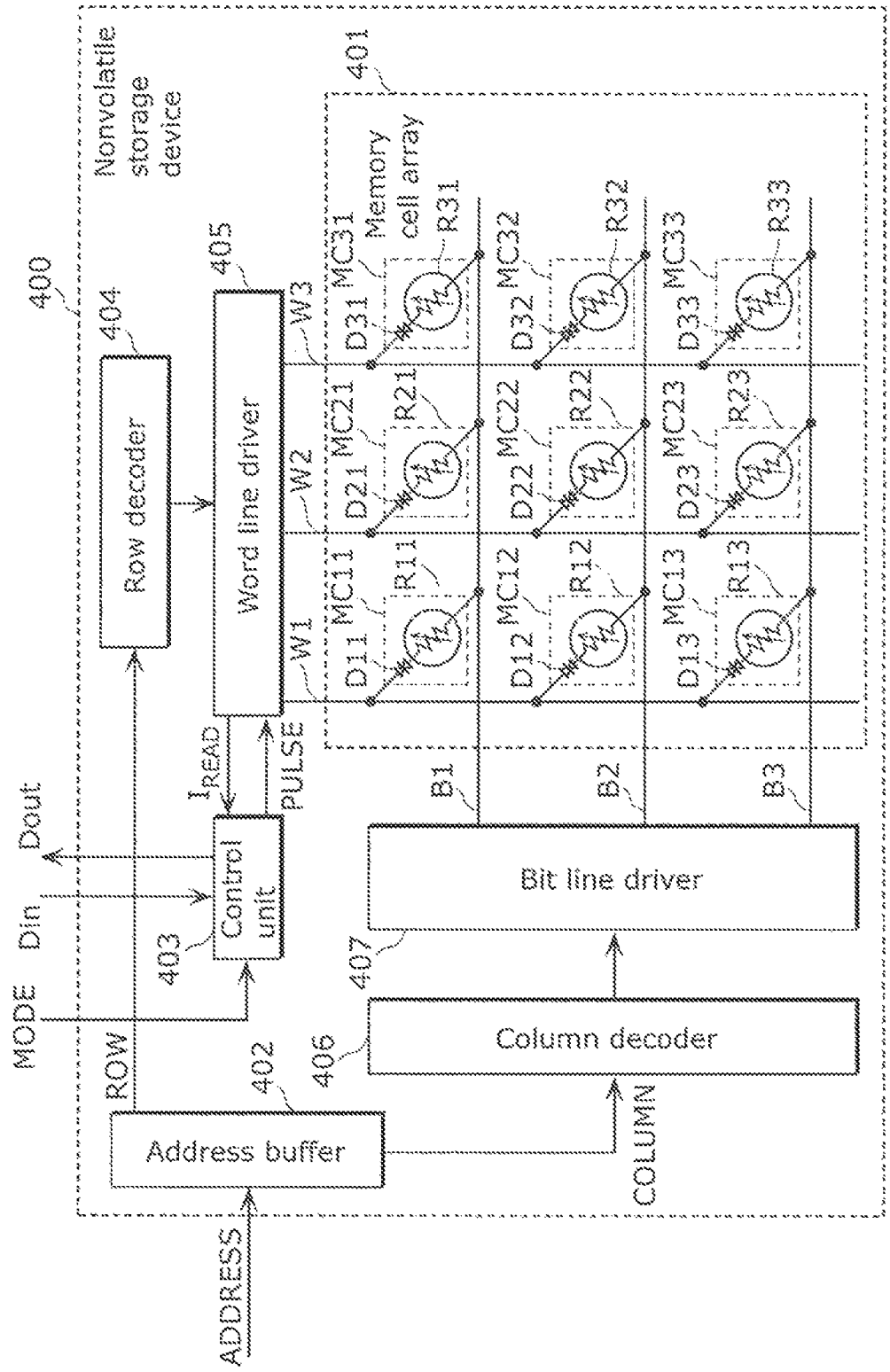

FIG. 17 is a block diagram illustrating an example configuration of a nonvolatile storage device according to Embodiment 4 in the present invention.

Figure 18:
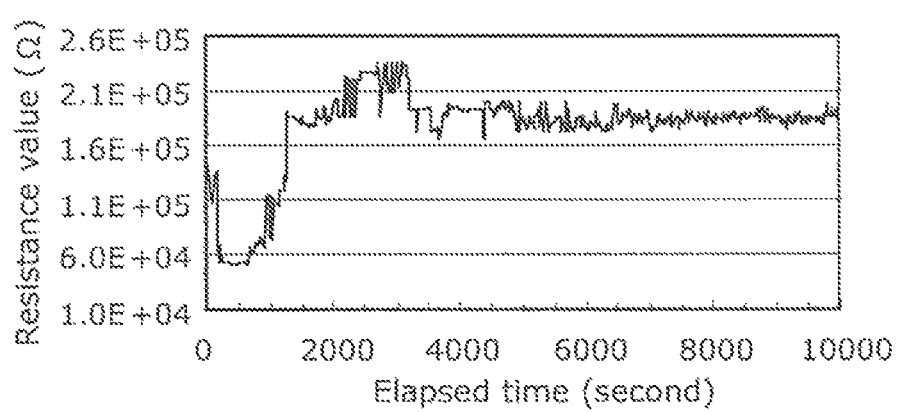

FIG. 18 shows the variation (fluctuations) in resistance value of a variable resistance element.

DESCRIPTION OF EMBODIMENTS

Before describing Embodiments of the present invention, the knowledge found by the Inventors from the experiments will be described in detail. The knowledge will be hereinafter described with reference to FIG. 18, which will be of some help to understand Embodiments of the present invention to be described later. Thus, the present invention is not limited by the drawing and the description.

Generally, any nonvolatile storage elements cannot avoid a situation where storage information changes within a finite length of time. The variable resistance nonvolatile storage element according to the present invention is no exception where it has characteristics that information once stored gradually changes with the passage of time. Here, the change in information is observed as change of a set resistance value with the passage of time. Generally, a phenomenon in which storage information is deteriorated according to gradual change from a high resistance state to a low resistance state or from a low resistance state to a high resistance state during a certain period of time is known.

The Inventors have found a new change phenomenon in which a resistance value increases or decrease for a short period of time in addition to the deterioration (deterioration in retention capability) in information to a certain degree according to gradual change in the resistance value for a long period of time (for example, over 100 hours). This phenomenon is observed when a nonvolatile storage element comprising a tantalum (Ta) oxide as a variable resistance material is set to a high resistance state, and is a phenomenon in which a set resistance value randomly varies during a short period of time, that is, within several minutes. The variable resistance nonvolatile storage element using a Ni oxide and having the similar change phenomenon in resistance value is reported (NPL 1: Daniele Ielmini et. al, Appl. Phys. Lett. Vol. 96, 2010, page 53503). Thus, the phenomenon seems a general phenomenon in the variable resistance nonvolatile storage element.

An example of the phenomenon will be hereinafter described. The Inventors have manufactured a nonvolatile storage element comprising an oxygen-deficient Ta oxide as a variable resistance material, operated it with application of electric pulses, and studied in detail how the set resistance value changed with the passage of time. The nonvolatile storage element is a variable resistance nonvolatile storage element having bipolar switching characteristics in which the state of the nonvolatile storage element is changed to a high resistance state with application of a positive voltage to the upper electrode with respect to the lower electrode whereas it is changed to a low resistance state with application of a negative voltage to the upper electrode with respect to the lower electrode.

FIG. 18 shows the result of measurement. The data was obtained when an electric pulse of +2.5 V with a pulse width of 100 ns and an electric pulse of −2.0 V with a pulse width of 100 ns were alternately applied 100 times in total to the prepared nonvolatile storage element connected in series with a load resistor with a resistance of 6.4 kΩ. The electric pulse of +2.5 V with the pulse width of 100 ns was finally applied to set the nonvolatile storage element to the high resistance state (approximately to a resistance value of 120 kΩ). The nonvolatile storage element was retained at a room temperature, and how the set resistance value (resistance value of the nonvolatile storage element then) changed with the passage of time was studied. FIG. 18 shows that although the nonvolatile storage element was retained at a room temperature and a voltage not enough to cause the resistance change is applied to the nonvolatile storage element, the resistance value of the nonvolatile storage element repeatedly and abruptly increases or decreases. In other words, the resistance value abruptly decreases to approximately 50 kΩ after first 200 seconds, then starts to increase after 1000 seconds, and reaches 200 kΩ. Afterward, the nonvolatile storage element has relatively a stable transition. In other words, the resistance value supposed to set to 120 kΩ largely increases or decreases for a short period of time, and the resistance value changes at each measurement timing.

The variable resistance nonvolatile storage element basically stores information in association with the size of a resistance value and data. There are several methods for reading data. Examples of the methods include a method for measuring a resistance value of the element itself and a method for measuring a current that flows through the element. However, in any of the cases, when a resistance state (data) is read from the element that is set to the resistance state, a predetermined threshold (determination point of data, or reference level) is set, and the data is judged according to whether or not a read physical amount (resistance value of the nonvolatile storage element, or current value of a current that flows through the nonvolatile storage element) is larger or smaller than the threshold.

For example, when the physical amount to be used for reading data from the nonvolatile storage element is defined as a resistance value, a state in which the nonvolatile storage element has a resistance value more (or higher) than or equal to a predetermined threshold is defined as a high resistance state, and a state in which the nonvolatile storage element has a resistance value less (or lower) than or equal to the predetermined threshold is defined as a low resistance state. For example, information is stored by allocating one of data "1" and data "0" to each of the resistance states.

However, information may be erroneously read with variation in the resistance as shown in FIG. 18. For example, assume a case where the nonvolatile storage element whose result is shown in FIG. 18 is set to the resistance value of 120 kΩ, and its threshold is set to the half of 60 kΩ. In other words, a resistance state higher than 60 kΩ is defined as a high resistance state, and a resistance state lower than 60 kΩ is defined as a low resistance state. When a resistance value of the nonvolatile storage element is read approximately at 1000 seconds after setting the resistance value, the resistance value is 50 kΩ, which indicates that the nonvolatile storage element is determined to be in the low resistance state. However, when the resistance value of the nonvolatile storage element read after 2000 seconds exceeds 200 kΩ, it is determined that the nonvolatile storage element is in the high resistance state. In other words, depending on the timing at which data of the nonvolatile storage element that is not rewritten is read, the data is identified by "1" or "0". Such a phenomenon that characterizes the nonvolatile storage element that stores information possibly leads to a fatal failure, and should be desirably prevented. However, there is no effective method disclosed for suppressing the phenomenon itself in which the resistance value varies as shown in FIG. 18.

The resistance change for a short period of time as observed in FIG. 18 is distinguished from the phenomenon for a long period of time, and is expressed as "fluctuations in resistance value" or simply "fluctuations".

Various embodiments of reading data from a nonvolatile storage element according to the present invention have been conceived based on the knowledge, and completed.

An aspect of the present invention is a method for reading data from a variable resistance nonvolatile storage element (i) including a first electrode, a second electrode, and a variable resistance layer disposed between and in contact with the first electrode and the second electrode and (ii) having characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, the method includes: detecting a current that flows through the nonvolatile storage element with application of a fixed voltage; and determining that (i) the nonvolatile storage element is in a high resistance state when the current detected in the detecting is smaller than a current reference level Iref, and (ii) the nonvolatile storage element is in a low resistance state when the current detected in the detecting is larger than the reference level Iref, the current reference level Iref being defined by (IRL+IRH)/2<Iref<IRL, where IRL denotes a current that flows through the nonvolatile storage element in the first resistance state RL with application of the fixed voltage, IRH denotes a current that flows through the nonvolatile storage element in the second resistance state RH, and IRH<IRL.

More specifically, the nonvolatile storage element is an element having fluctuations that are characteristics in which a resistance value of the nonvolatile storage element in the second resistance state RH randomly changes with passage of time.

Thus, the current reference level to be referenced for determining one of the low resistance state and the high resistance state of the nonvolatile storage element is set to a value closer to a current value of a current that flows in the low resistance state with application of a fixed voltage than a median value between the current value of the current that flows in the low resistance state and a current value of a current that flows in the high resistance state with application of a fixed voltage. Thus, the occurrence frequency of an error in reading data that is caused by the larger fluctuation in the resistance value of the nonvolatile storage element in the high resistance state is reduced more than by the fluctuation in the resistance value of the nonvolatile storage element in the low resistance state.

Here, in the determining, a current value larger than an average value of the fluctuations by at least 4σ is preferably determined as the current reference level Iref satisfying (IRL+IRH)/2<Iref<IRL, where σ denotes a standard deviation in the fluctuations of the current value IRH of the nonvolatile storage element in the second resistance state RH. Accordingly, it is possible to accurately determine most of the nonvolatile storage elements in the high resistance state to be in the high resistance state.

Furthermore, another aspect of the present invention is a method for reading data from a variable resistance nonvolatile storage element (i) including a first electrode, a second electrode, and a variable resistance layer disposed between and in contact with the first electrode and the second electrode and (ii) having characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, the method includes: detecting a resistance value of the nonvolatile storage element; and determining that (i) the nonvolatile storage element is in a low resistance state when the resistance value detected in the detecting is smaller than a resistance reference level Rref, and (ii) the nonvolatile storage element is in a high resistance state when the resistance value detected in the detecting is larger than the resistance reference level Rref, the resistance reference level Rref being defined by RL<Rref<(RL+RH)/2.

More specifically, the nonvolatile storage element is an element having fluctuations that are characteristics in which a resistance value of the nonvolatile storage element in the second resistance state RH randomly changes with passage of time.

Thus, the resistance reference level to be referenced for determining one of the low resistance state and the high resistance state of the nonvolatile storage element is set to a value closer to a resistance value of the nonvolatile storage element in the low resistance state than a median value between the resistance value of the nonvolatile storage element in the low resistance state and a resistance value of the nonvolatile storage element in the high resistance state. Thus, the occurrence frequency of an error in reading data that is caused by the larger fluctuation in the resistance value of the nonvolatile storage element in the high resistance state is reduced more than by the fluctuation in the resistance value of the nonvolatile storage element in the low resistance state.

Here, in the determining, a resistance value smaller than an average value of the fluctuations by at least 4σ is preferably determined as the resistance reference level Rref satisfying RL<Rref<(RL+RH)/2, where σ denotes a standard deviation in the fluctuations of the resistance value of the nonvolatile storage element in the second resistance state RH. Accordingly, it is possible to accurately determine most of the nonvolatile storage elements in the high resistance state to be in the high resistance state.

Here, as an example of a material of the nonvolatile storage element, the variable resistance layer preferably has a stacked structure including (i) a first transition metal oxide comprising a first transition metal and (ii) a second transition metal oxide comprising a second transition metal, the first transition metal oxide being higher in oxygen deficiency than the second transition metal oxide. Furthermore, a condition that the second transition metal oxide is larger in resistance value than the first transition metal oxide may be satisfied.

Here, the first transition metal oxide may be identical to the second transition metal oxide. For example, the first transition metal oxide and the second transition metal oxide may comprise tantalum.

Furthermore, the first transition metal oxide may be different from the second transition metal oxide.

The second transition metal oxide is preferably lower in standard electrode potential than the first transition metal oxide.

Furthermore, another aspect of the present invention to achieve the object is a nonvolatile storage device including: a variable resistance nonvolatile storage element; and a control unit configured to read data from the nonvolatile storage element, wherein the nonvolatile storage element (i) includes a first electrode, a second electrode, and a variable resistance layer disposed between and in contact with the first electrode and the second electrode and (ii) has characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, and the control unit is configured to: detect a current that flows through the nonvolatile storage element with application of a fixed voltage; and determine that (i) the nonvolatile storage element is in a high resistance state when the detected current is smaller than a current reference level Iref, and (ii) the nonvolatile storage element is in a low resistance state when the detected current is larger than the reference level Iref, the current reference level Iref being defined by (IRL+IRH)/2<Iref<IRL, where IRL denotes a current that flows through the nonvolatile storage element in the first resistance state RL with application of the fixed voltage, IRH denotes a current that flows through the nonvolatile storage element in the second resistance state RH, and IRH<IRL.

More specifically, the nonvolatile storage element is an element having fluctuations that are characteristics in which a resistance value of the nonvolatile storage element in the second resistance state RH randomly changes with passage of time.

Thus, the current reference level to be referenced for determining one of the low resistance state and the high resistance state of the nonvolatile storage element is set to a value closer to a current value of a current that flows in the low resistance state with application of a fixed voltage than a median value between the current value of the current that flows in the low resistance state and a current value of a current that flows in the high resistance state with application of a fixed voltage. Thus, the occurrence frequency of an error in reading data that is caused by the larger fluctuation in the resistance value of the nonvolatile storage element in the high resistance state is reduced more than by the fluctuation in the resistance value of the nonvolatile storage element in the low resistance state.

Here, the control unit is preferably configured to determine a current value larger than an average value of the fluctuations by at least 4σ as the current reference level Iref satisfying (IRL+IRH)/2<Iref<IRL, where σ denotes a standard deviation in the fluctuations of the current value IRH of the nonvolatile storage element in the second resistance state RH. Accordingly, it is possible to accurately determine most of the nonvolatile storage elements in the high resistance state to be in the high resistance state.

Furthermore, another aspect of the present invention is a nonvolatile storage device including: a variable resistance nonvolatile storage element; and a control unit configured to read data from the nonvolatile storage element, wherein the nonvolatile storage element (i) includes a first electrode, a second electrode, and a variable resistance layer disposed between and in contact with the first electrode and the second electrode and (ii) has characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, the control unit is configured to: detect a resistance value of the nonvolatile storage element; and determine that (i) the nonvolatile storage element is in a low resistance state when the detected resistance value is smaller than a resistance reference level Rref, and (ii) the nonvolatile storage element is in a high resistance state when the detected resistance value is larger than the resistance reference level Rref, the resistance reference level Rref being defined by RL<Rref<(RL+RH)/2.

More specifically, the nonvolatile storage element is an element having fluctuations that are characteristics in which a resistance value of the nonvolatile storage element in the second resistance state RH randomly changes with passage of time.

Thus, the resistance reference level to be referenced for determining one of the low resistance state and the high resistance state of the nonvolatile storage element is set to a value closer to a resistance value of the nonvolatile storage element in the low resistance state than a median value between the resistance value of the nonvolatile storage element in the low resistance state and a resistance value of the nonvolatile storage element in the high resistance state. Thus, the occurrence frequency of an error in reading data that is caused by the larger fluctuation in the resistance value of the nonvolatile storage element in the high resistance state is reduced more than by the fluctuation in the resistance value of the nonvolatile storage element in the low resistance state.

Here, the control unit is preferably configured to determine a resistance value smaller than an average value of the fluctuations by at least 4σ as the resistance reference level Rref satisfying RL<Rref<(RL+RH)/2, where σ denotes a standard deviation in the fluctuations of the resistance value of the nonvolatile storage element in the second resistance state RH. Accordingly, it is possible to accurately determine most of the nonvolatile storage elements in the high resistance state to be in the high resistance state.

Here, as an example of a material of the nonvolatile storage element, the variable resistance layer preferably has a stacked structure including (i) a first transition metal oxide comprising a first transition metal and (ii) a second transition metal oxide comprising a second transition metal, the first transition metal oxide being higher in oxygen deficiency than the second transition metal oxide. Furthermore, a condition that the second transition metal oxide is larger in resistance value than the first transition metal oxide may be satisfied.

Here, the first transition metal oxide may be identical to the second transition metal oxide. For example, the first transition metal oxide and the second transition metal oxide may comprise tantalum.

Furthermore, the first transition metal oxide may be different from the second transition metal oxide.

The second transition metal oxide is preferably lower in standard electrode potential than the first transition metal oxide.

Embodiments according to the present invention will be described with reference to the drawings. Embodiments to be described hereinafter indicate specific and preferable examples of the present invention. The values, shapes, materials, constituent elements, positions and connections of the constituent elements, steps, and orders of the steps indicated in Embodiments are examples, and do not limit the present invention. Furthermore, the constituent elements in Embodiments that are not described in independent Claims that describe the most generic concept of the present invention are described as arbitrary constituent elements for composing more preferable embodiments.

Embodiment 1

Embodiment 1 will describe how to reduce the influence of the fluctuation phenomenon in resistance value of a variable resistance nonvolatile storage element comprising an oxygen-deficient Ta oxide in a variable resistance layer, depending on how to set a determination point when the state of the nonvolatile storage element is determined between the low resistance state and the high resistance state by measuring the resistance value itself. In order to do so, the following will first describe a structure of a sample used and a method for manufacturing the sample, and finally how to set the determination point.

[Structure of Nonvolatile Storage Element]

Figure 1:
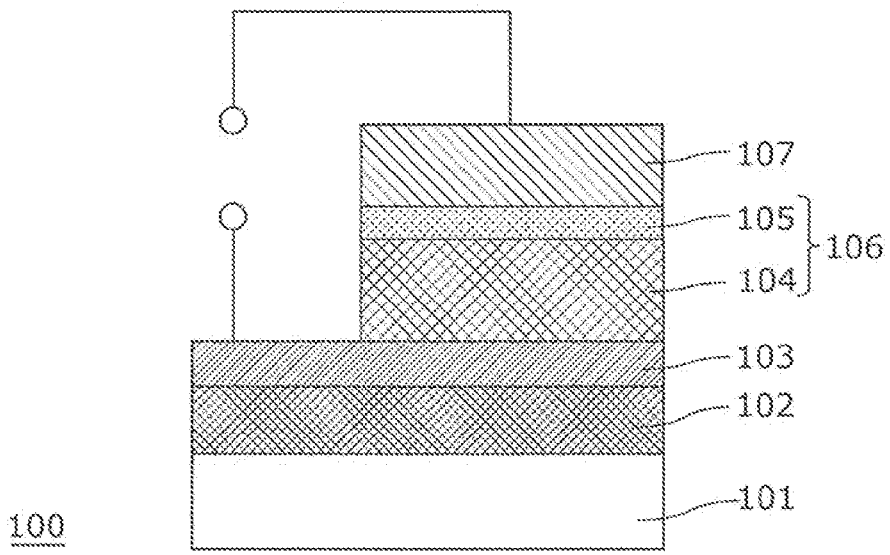
FIG. 1 illustrates a cross-sectional view of a structure of a nonvolatile storage element according to Embodiment 1 in the present invention.

FIG. 1 illustrates a cross-sectional view of an example structure of a nonvolatile storage element according to Embodiment 1 of the present invention.

As illustrated in FIG. 1, a nonvolatile storage element 100 according to Embodiment 1 includes a substrate 101, an oxide layer 102 formed on the substrate 101, a lower electrode 103 formed on the oxide layer 102, a variable resistance layer 106, and an upper electrode 107. Here, the variable resistance layer 106 is a stacked layer including: a first transition metal oxide layer 104 comprising an oxygen-deficient transition metal oxide; and a second transition metal oxide layer 105 comprising an oxygen-deficient transition metal oxide having an oxygen deficiency lower than that of the first transition metal oxide layer 104. According to Embodiment 1, the variable resistance layer 106 is a stacked layer including a first oxygen-deficient tantalum oxide layer (hereinafter referred to as "first Ta oxide layer") 104 and a second tantalum oxide layer (hereinafter referred to as "second Ta oxide layer") 105. Here, the second Ta oxide layer 105 has an oxygen content percentage higher than that of the first Ta oxide layer 104. In other words, the first Ta oxide layer 104 has an oxygen deficiency higher than that of the second Ta oxide layer 105. The oxygen deficiency refers to a ratio of deficient oxygen in a transition metal oxide, relative to the amount of oxygen included in the oxide having its stoichiometric composition. For example, when the transition metal is tantalum (Ta), the stoichiometric composition of the oxide is $Ta_2O_5$, which can be expressed as $TaO_{2.5}$. Here, the oxygen deficiency of $TaO_2O_5$ is 0%. For example, the oxygen deficiency of an oxygen-deficient tantalum oxide whose composition is expressed as $TaO_{1.5}$ is determined by; the oxygen deficiency=(2.5−1.5)/2.5=40%. The oxygen content percentage of $Ta_2O_5$ is a ratio of oxygen to the total number of atoms (O/(Ta+O)) and is thus 71.4 atm %. This means that an oxygen-deficient tantalum oxide has an oxygen content percentage higher than 0 and lower than 71.4 atm %. The second Ta oxide layer 105 has a resistance value (strictly speaking, specific resistance) higher than that of the first Ta oxide layer 104.

A metal included in the variable resistance layer 106 may be a transition metal other than tantalum. Usable transition metals include tantalum (Ta), titanium (Ti), hafnium (Hf), zirconium (Zr), niobium (Nb), and tungsten (W). Since the transition metal capable of taking a plurality of oxidation states may have different resistance states by an oxidation-reduction reaction. For example, it has been able to verify that the resistance value of the variable resistance layer 106 can be stably changed at high speed in the case where a hafnium oxide is used so that the first hafnium oxide layer 104 has a composition of $HfO_x$ and the second hafnium oxide layer 105 has a composition of $HfO_y$, where x is between 0.9 and 1.6 inclusive and y is larger than x in value. In this case, the thickness of the second hafnium oxide layer 105 is preferably 3 to 4 nm. Furthermore, it has been able to verify that the resistance value of the variable resistance layer 106 can be stably changed at high speed in the case where a zirconium oxide is used so that the first zirconium oxide layer 104 has a composition of $ZrO_x$ and the second zirconium oxide layer 105 has a composition of $ZrO_y$, where x is between 0.9 and 1.4 inclusive and y is larger than x in value. In this case, the thickness of the second zirconium oxide layer 105 is preferably 1 to 5 nm.

The first transition metal included in the first transition metal oxide layer 104 and the second transition metal included in the second transition metal oxide layer 105 may be different from each other. In this case, it is preferable that the second transition metal oxide layer 105 has a lower oxygen deficiency, that is, higher resistance, than that of the first transition metal oxide layer 104. With such a structure, a voltage applied between the lower electrode 103 and the upper electrode 107 in changing the resistance state is distributed more to the second transition metal oxide layer 105, which can ease the occurrence of an oxidation-reduction reaction in the second transition metal oxide layer 105. Furthermore, in the case where the first transition metal and the second transition metal use mutually different materials, it is preferable that the second transition metal is lower in standard electrode potential than the first transition metal. This is because an oxidation-reduction reaction in a tiny filament (i.e., a conductive path) formed in the second transition metal oxide layer 105 having high resistance changes the resistance value, which presumably results in the resistance change phenomenon. For example, a stable resistance change operation is achieved when the first transition metal oxide layer 104 comprises an oxygen-deficient tantalum oxide while the second transition metal oxide layer 105 comprises a titanium oxide ($TiO_2$). Titanium (with the standard electrode potential=−1.63 eV) is a material having a lower standard electrode potential than that of tantalum (with the standard electrode potential=−0.6 eV). The standard electrode potential having a larger value represents a property of being more difficult to oxidize. Placing, in the second transition metal oxide layer 105, a metal oxide having a lower standard electrode potential than that of the first transition metal oxide layer 104 makes an oxidation-reduction reaction more likely to occur in the second transition metal oxide layer 105.

Each resistance change phenomenon in the variable resistance layer having a stacked structure of the above materials presumably occurs by an oxidation-reduction reaction in a tiny filament formed in the second transition metal oxide layer 105 having high resistance, which changes the resistance value. Specifically, with application of a positive voltage to the upper electrode 107 closer to the second transition metal oxide layer 105 with respect to the lower electrode 103, oxygen ions in the variable resistance layer 106 are attracted toward the second transition metal oxide layer 105. This causes an oxidation reaction in the tiny filament formed in the second transition metal oxide layer 105, which presumably increases the resistance of the tiny filament. Conversely, with application of a negative voltage to the upper electrode 107 closer to the second transition metal oxide layer 105 with respect to the lower electrode 103, oxygen ions in the second transition metal oxide layer 105 are forced toward the first transition metal oxide layer 104. This causes a reduction reaction in the tiny filament formed in the second transition metal oxide layer 105, which presumably decreases the resistance of the tiny filament.

The upper electrode 107 connected to the second transition metal oxide layer 105 having a lower oxygen deficiency comprises, for example, platinum (Pt) and iridium (Ir) which are materials each having a higher standard electrode potential than those of transition metals included in the second transition metal oxide layer 105 and materials included in the lower electrode 103. Such a structure allows an oxidation-reduction reaction to selectively occur in the second transition metal oxide layer 105 near the interface between the upper electrode 107 and the second transition metal oxide layer 105, which provides a stable resistance change phenomenon.

When the nonvolatile storage element 100 with the structure is driven, an external power source applies a voltage that satisfies a predetermined condition, between the lower electrode 103 and the upper electrode 107.

[Method for Manufacturing Nonvolatile Storage Element]

Next, a method for manufacturing the nonvolatile storage element 100 according to Embodiment 1 will be described.

First, thermal oxidation produces the oxide layer 102 having a thickness of 200 nm on the substrate 101 which is a single-crystal silicon. Then, a tantalum oxide (TaN) layer having a thickness of 40 nm is formed as the lower electrode 103 on the oxide layer 102 using reactive sputtering with which a Ta target is sputtered in a mixed gas of argon (Ar) and nitrogen ($N_2$).

Then, the first oxygen-deficient Ta oxide layer 104 is deposited on the lower electrode 103. Here, the first oxygen-deficient Ta oxide is formed using the reactive sputtering with which a Ta target is sputtered in Ar and oxygen ($O_2$) gas. The specific sputtering conditions when the oxygen-deficient Ta oxide is deposited are: power of 1000 W, the Ar gas flow rate of 20 sccm, the $O_2$ gas flow rate of 20 sccm, and the total gas pressure of 0.05 Pa. Under these conditions, the first oxygen-deficient Ta oxide layer 104 having an oxygen content percentage of approximately 56 atm % and the resistivity of 2 mΩcm is deposited. Furthermore, the first oxygen-deficient Ta oxide layer 104 has a thickness of 45 nm.

Next, the second oxygen-deficient Ta oxide layer 105 is deposited on the surface of the first oxygen-deficient Ta oxide layer 104 by sputtering the $TaO_2$ target. The sputtering conditions are power of 200 W, the Ar gas flow rate of 300 sccm, and the total gas pressure of 0.3 Pa. Accordingly, the second oxygen-deficient Ta oxide layer 105 having an oxygen content percentage closer to 72 atm % is deposited with a thickness of 5.5 nm (the layer is provided to stabilize the initial operation of the element, and thus, it is not always necessary to provide the layer when the element is formed).

Then, the upper electrode 107 is formed on the second oxygen-deficient Ta oxide layer 105. Here, the upper electrode 107 comprises, for example, iridium (Ir). Specifically, the upper electrode 107 is formed with a thickness of 50 nm by sputtering the Ir target in the Ar gas.

With the processes, the nonvolatile storage element 100 can be manufactured in which the variable resistance layer 106 comprising an oxygen-deficient Ta oxide is disposed between the lower electrode 103 and the upper electrode 107.

[Setting Resistance Values]

The electric pulse signal was applied between the lower electrode 103 and the upper electrode 107 of the nonvolatile storage element 100 manufactured as described above to cause a resistance change. The case where a voltage pulse is applied as an electric pulse signal will be described hereinafter. As long as a current pulse other than the voltage pulse generates a voltage to be described below, any current pulse will do.

The positive and negative polarities of a voltage are represented with respect to the lower electrode 103. In other words, a higher voltage applied to the upper electrode 107 with respect to the lower electrode 103 is represented by a positive polarity, and conversely, a lower voltage applied to the upper electrode 107 with respect to the lower electrode 103 is represented by a negative polarity. When a positive voltage is applied to the nonvolatile storage element 100 manufactured as described above, the state of the nonvolatile storage element 100 is changed to the high resistance state. Conversely, when a negative voltage is applied to the nonvolatile storage element 100, the state of the nonvolatile storage element 100 is changed to the low resistance state.

Figure 2:
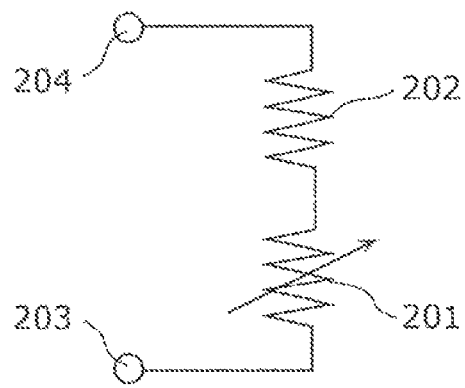
FIG. 2 illustrates a circuit diagram when a voltage pulse is applied to a nonvolatile storage element according to Embodiment 1.

According to Embodiment 1, a voltage was applied to a variable resistance nonvolatile storage element 201 (corresponding to the nonvolatile storage element 100) that is connected in series with a load resistor 202 with various resistances of 0 to 6.4 kΩ. Specifically, the electrical pulses of voltages of +2.5 V and −2.0 V with a length (pulse width) of 100 ns were alternately applied 100 times between terminals 203 and 204 in FIG. 2.

There are the two reasons why the variable resistance nonvolatile storage element 201 is connected to the load resistor 202. One is that the set resistance value of the nonvolatile storage element 201 changes by being connected to the load resistor 202, and information on various resistance ranges can be obtained. The sample used in Embodiment 1 has characteristics in which the low resistance value of the nonvolatile storage element 201 is equivalent to that of the load resistor 202. Furthermore, the high resistance value thereof frequently ranges between 10 to 100 times of the low resistance values. Thus, when the load resistor 202 has a low resistance value, the resistance value of the nonvolatile storage element 201 can be set lower. Conversely, when the load resistor 202 has a high resistance value, the resistance value of the nonvolatile storage element 201 can be set higher.

The second reason is that it is expected that the fluctuation phenomenon of resistance values may occur when the nonvolatile storage element 201 is actually used. The variable resistance nonvolatile storage element is not used alone when it is actually used, but is used in a state of being connected to a transistor or a diode having a certain resistance value. Otherwise, the variable resistance nonvolatile storage element has a little more resistance due to the wiring. Thus, assuming the external load resistance occurring in the actual use, the nonvolatile storage element 201 was connected to the load resistor 202.

As described above, the nonvolatile storage element 201 was set to a high resistance state (represented by a resistance value RH) and a low resistance state (represented by a resistance value RL). When the nonvolatile storage element 201 was set to the high resistance state, the electric pulses of +2.5 V and −2.0 V were alternatively applied 100 times, and finally, the electric pulse of +2.5 V was applied once. Conversely, when the nonvolatile storage element 201 was set to the low resistance state, filially, the electric pulse of −2.0 V was applied once. The pulse width was 100 ns in both cases.

[Measuring Variations in Resistance Value for a Short Period of Time]

Figure 3:
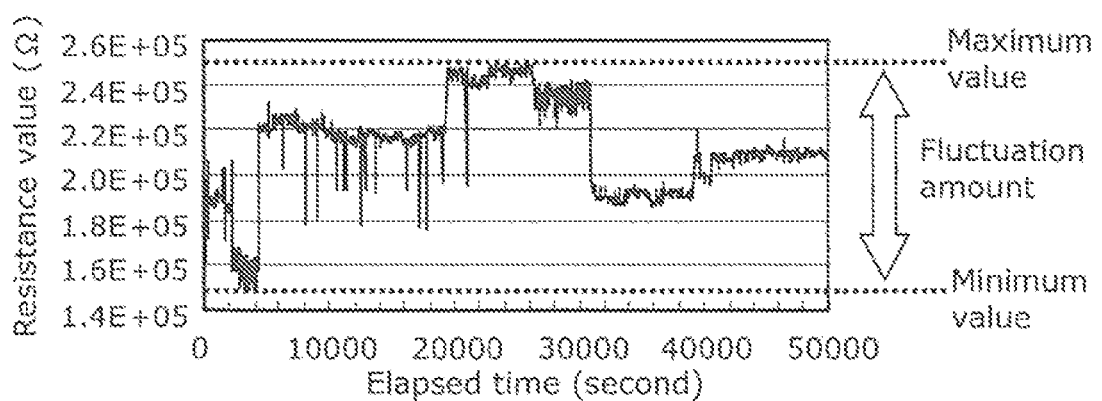
FIG. 3 illustrates the variation in resistance value of a nonvolatile storage element according to Embodiment 1.

With the procedure, the sample of the nonvolatile storage element 201 to which the resistance value was set was retained at a room temperature, and the resistance value of the nonvolatile storage element 201 was measured with application of a voltage of 50 mV every 20 seconds. The nonvolatile storage element 201 had no change in the resistance value this time with application of the voltage of approximately 50 mV used in the measurement. FIG. 3 shows an example of the result. Specifically, FIG. 3 shows the result of measurement of resistance values of the nonvolatile storage element up to 50,000 seconds by setting, to the high resistance state, the nonvolatile storage element connected to a load resistor of 6.4 kΩ. The vertical axis of FIG. 3 shows the resistance values of a single nonvolatile storage element that are calculated by subtracting the load resistance of 6.4 kΩ. Here, the resistance value immediately after the setting is approximately 170 kΩ. However, the graph shows that the resistance values increase or decrease with the passage of time, and the fluctuation phenomenon occurs. In other words, in the fluctuation phenomenon, the resistance value has decreased to the minimum value of 150 kΩ at approximately 2,000 seconds, and the resistance value has increased to the maximum value of 250 kΩ at approximately 20,000 seconds after starting the measurement.

Figure 4:
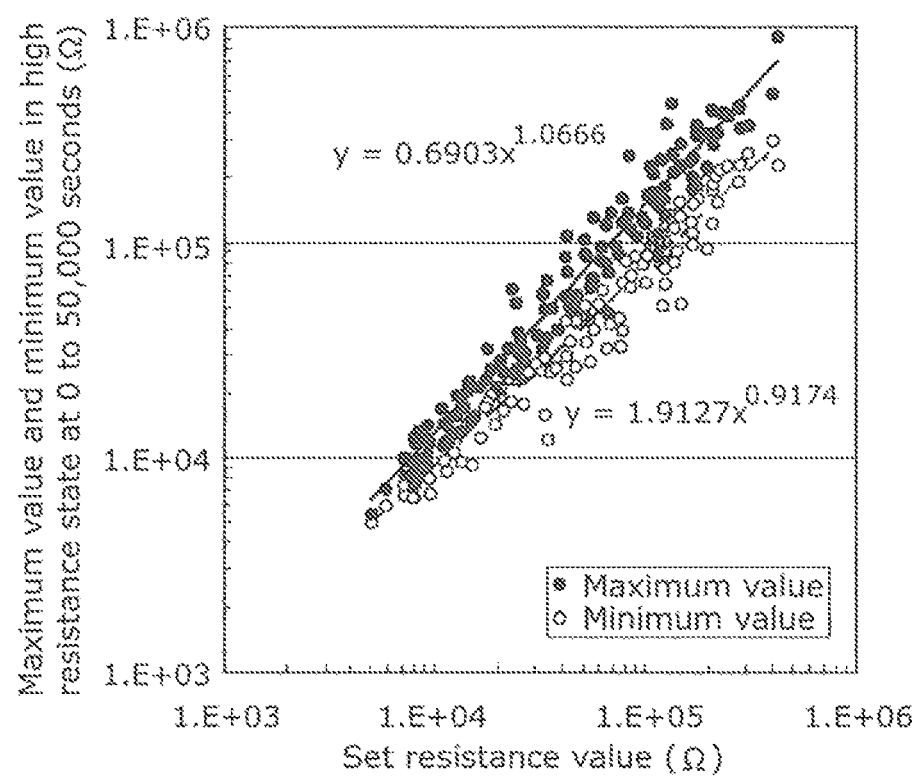
FIG. 4 shows the plotted maximum values and minimum values of variation in resistance value of a nonvolatile storage element in the high resistance state according to Embodiment 1.

The similar measurement was conducted on nonvolatile storage elements by being connected to each of load resistors of 0Ω (no load), 1700Ω, 2150Ω, 3850Ω, 4250Ω, and 6400Ω. FIG. 4 is a summary of the results. FIG. 4 shows the plotted results of (a) the set resistance values of the nonvolatile storage elements in the horizontal axis, and (b) the maximum values and the minimum values of the resistance values of the nonvolatile storage elements from start of the measurement to 50,000 seconds in the vertical axis. The data items represented by black circles indicate the maximum values, and the data items represented by white circles indicate the minimum values. Furthermore, FIG. 4 also shows the results of fitting the data items. The solid line indicates the result of fitting the maximum values, and the broken line indicates the result of fitting the minimum values.

FIG. 4 shows, for example, when the set resistance value is 100 kΩ, the resistance values range approximately between 80 kΩ and 200 kΩ on average with fluctuation. FIG. 4 also shows relational expressions (approximate expressions) obtained from the fittings. In the relational expressions, x is a set resistance value, and y is the maximum value or the minimum value.

Figure 5:
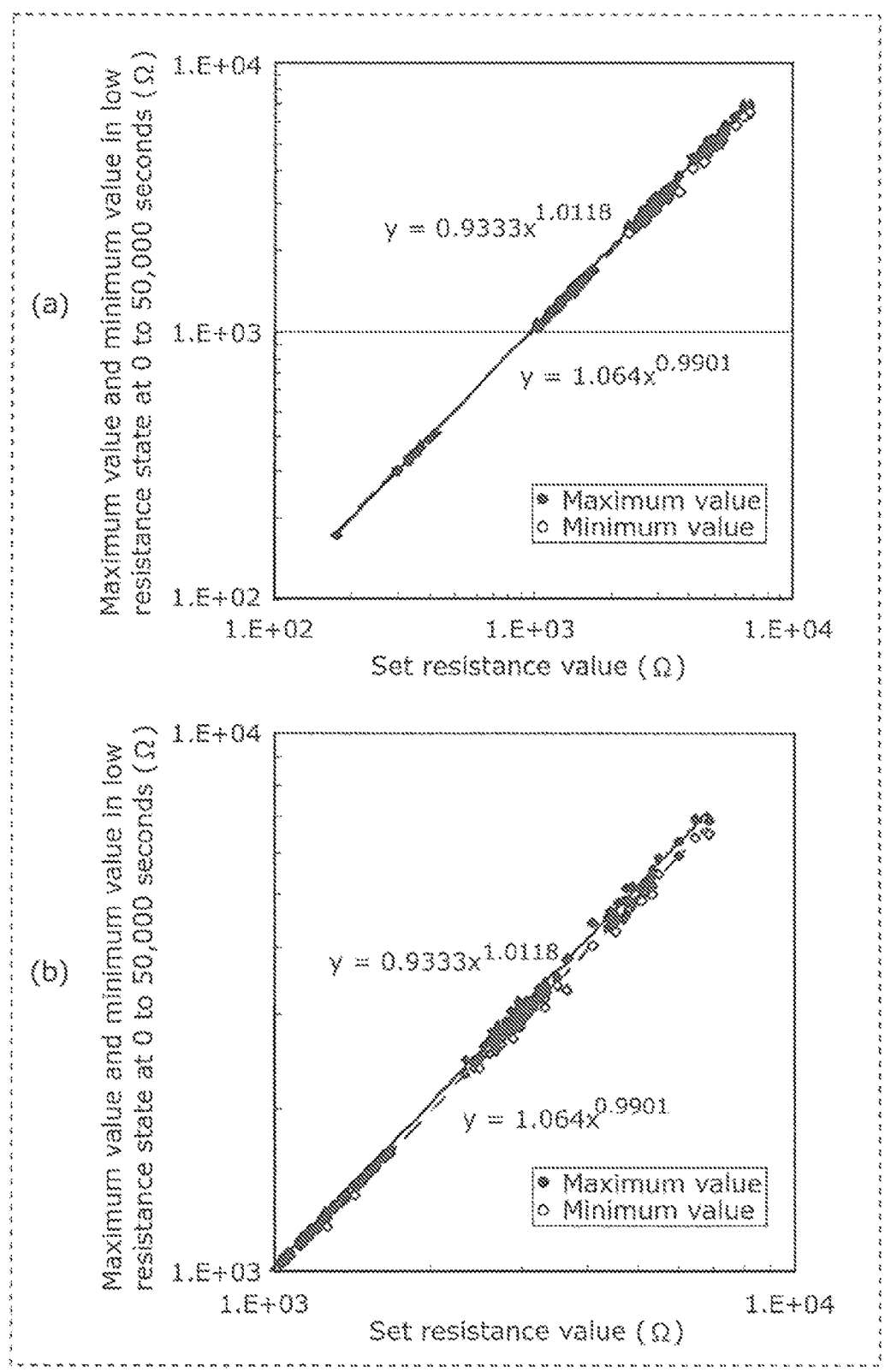
FIG. 5 shows the plotted maximum values and minimum values of variation in resistance value of a nonvolatile storage element in the low resistance state according to Embodiment 1.

The similar measurement was also conducted in the low resistance state. (a) of FIG. 5 shows the result. Here, (b) of FIG. 5 shows an enlarged result of (a) of FIG. 5 in order to easily understand a part of (a). In FIG. 5, the data items represented by black rhombic marks indicate the maximum values, and the data items represented by white rhombic marks indicate the minimum values. Furthermore, the solid line and the broken line indicate the result of fitting the maximum values and the result of fitting the minimum values, respectively. FIG. 5 shows that the resistance variations (fluctuations) in the low resistance state are smaller than those in the high resistance state.

[Influence of Variations in Resistance Value on Setting Values for a Short Period of Time]

Next, using the results of FIGS. 4 and 5, how much degree and at which probability the resistance values fluctuate according to the variations (fluctuations) for a short period of time was estimated. The methods will be described hereinafter.

In order to estimate the influence of the resistance variations, it is necessary to separately estimate (i) at how much degree the resistance values of the nonvolatile storage elements that were set to the high resistance state vary upward (increase) and (ii) at how much degree the resistance values vary downward (decrease), or (i) at how much degree the resistance values of the nonvolatile storage elements that were set to the low resistance state vary upward and (ii) at how much degree the resistance values vary downward.

When the data items in FIG. 4 are normally distributed as a representative example, the procedure for estimating at how much degree and at which probability the resistance values of the nonvolatile storage elements that are set to the high resistance state vary upward or downward will be described hereinafter.

Figure 6:
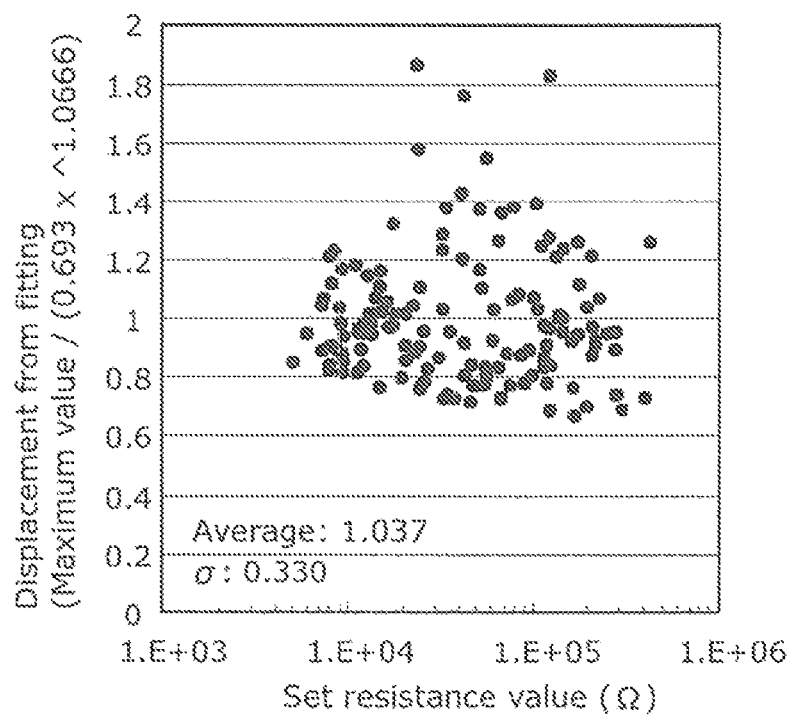
FIG. 6 shows the plotted maximum values of variation in resistance value of a nonvolatile storage element in the high resistance state according to Embodiment 1.

First, each of the results of measurement (value of each of the black circles) is divided by a corresponding result of fitting the maximum values of the resistance variations in the high resistance state of FIG. 4 (solid line in FIG. 4). Specifically, each of the results of measurement is divided by $0.6903 \times (\text{set resistance value})^{1.0666}$ that represents the result of fitting. Accordingly, the result as shown in FIG. 6 is obtained. FIG. 6 shows how many times the result of measurement is larger than the result of fitting (namely, displacement from the result of fitting), where the horizontal axis represents the set resistance values and the vertical axis represents the results of the division. According to the results, the displacement from the fitting does not strongly depend on the set resistance values, and the results of measurement are distributed with some variations. Here, the calculated average value and standard deviation ($\sigma$) are 1.037 and 0.330, respectively.

Next, at how much degree and in which range the maximum values of the resistance values of the nonvolatile storage elements that are set to the high resistance state are present was estimated, using the results of FIG. 6. More specifically, the resistance values when the distribution is represented by (+a×$\sigma$) are calculated by:

$$(1.037 + a \times 0.330) \times 0.6903 \times (\text{set resistance value})^{1.0666} \quad (1).$$

The resistance values when the distribution is represented by −a×$\sigma$) are calculated by:

$$(1.037 - a \times 0.330) \times 0.6903 \times (\text{set resistance value})^{1.0666} \quad (2).$$

According to a statistic theory, these values indicate that for example, in the case of a=1, 68.27% of all the data items of the resistance values are distributed in a range obtained by the equations (1) and (2) (that is, the external range is 31.73%), In the case of a=2, 95.45% (external range 4.55%) of all the data items are distributed. In the case of a=3, 99.73% (external range 0.27%) of all the data items are distributed. In the case of a=4, 99.9937% (external range 0.0063%) of all the data items are distributed.

Figure 7:
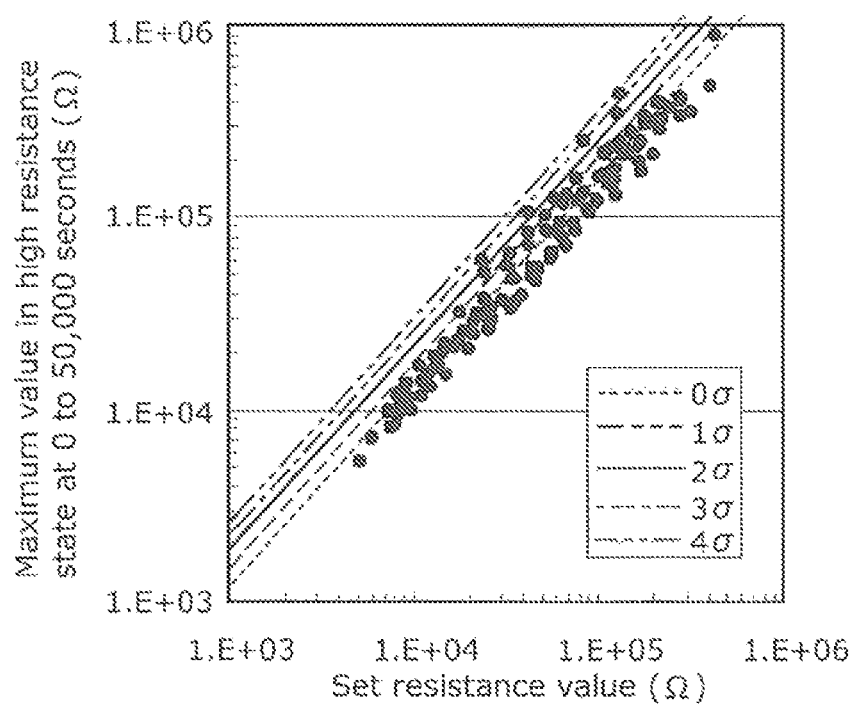
FIG. 7 shows the plotted maximum values of variation in resistance value of a nonvolatile storage element in the high resistance state according to Embodiment 1.

The calculation is intended to find out at how much degree the resistance values of the nonvolatile storage elements vary upward. Here, only the equation (1) was focused on, and how the resistance values represented by (+1×$\sigma$), (+2×$\sigma$), (+3×$\sigma$), and (+4×$\sigma$) (hereinafter denoted as (+1$\sigma$), (+2$\sigma$), (+3$\sigma$), and (+4$\sigma$, respectively) are distributed was calculated. FIG. 7 shows the results. FIG. 7 shows that as $\sigma$ increases, the variation amount of the resistance values of the nonvolatile storage elements increases (however, the occurrence probability is very small). Assuming that the displacement from the fitting in FIG. 4 is normally distributed, approximately 15.87% (=(100−68.27)/2) of all the data items are present above the line representing 1$\sigma$. Approximately 2.28% is present above the line representing 2$\sigma$, approximately 0.14% is present above the line representing 3$\sigma$, and approximately 0.0032% is present above the line representing 4$\sigma$. Although not described herein, similar calculations are performed for the resistance values varying downward in the high resistance state and the resistance values varying upward and downward in the low resistance state to find out the influence of variations in resistance value for a short period of time.

[Method for Determining One of High Resistance State and Low Resistance State]

With the procedure, it becomes possible to estimate at how much degree and at which probability a set resistance value varies with the fluctuation phenomenon. However, since the result shown in FIG. 7 is not clear, assuming the actual operation of the variable resistance nonvolatile storage element, the specific influence of the variation phenomenon on the resistance values was estimated.

Figure 8:
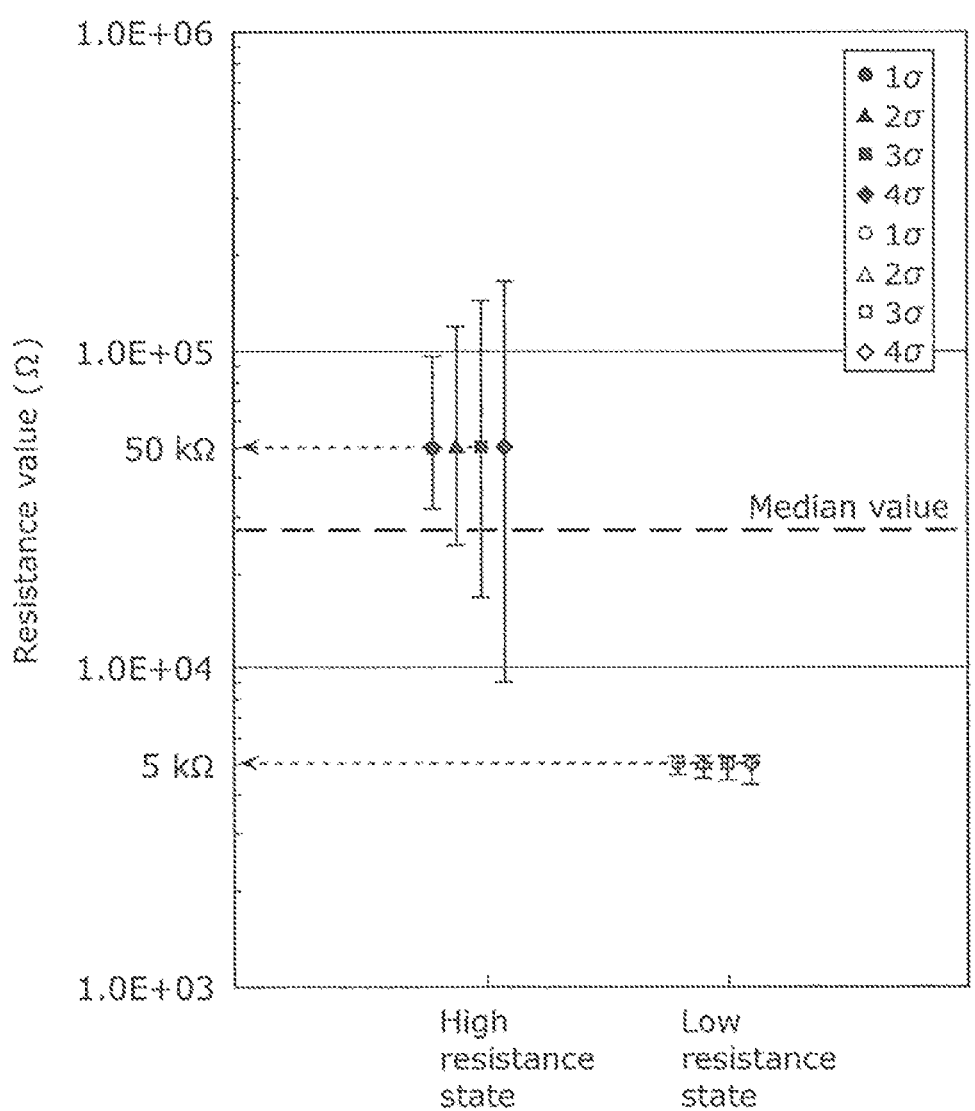
FIG. 8 is a diagram for describing the influence of a resistance variation phenomenon of a nonvolatile storage element according to Embodiment 1.

First, assume that a nonvolatile storage element has a resistance value of 5 k$\Omega$ in the low resistance state, and a resistance value of 50 k$\Omega$ in the high resistance state. These resistance values are typically possible values when the nonvolatile storage element according to Embodiment 1 operates by being connected to a load resistor of several k$\Omega$. FIG. 8 is a summary of the calculated influence of the fluctuations.

In FIG. 8, when the resistance value of the nonvolatile storage element in the high resistance state is set to 50 k$\Omega$, the resistance variation distributed within a range of 1$\sigma$ is represented by an error bar with a black circle. The resistance variations distributed within ranges of 2$\sigma$, 3$\sigma$, and 4$\sigma$ are represented by error bars with a black triangle, a black square, and a black rhombus, respectively.

When the resistance value of the nonvolatile storage element in the low resistance state is set to 5 k$\Omega$, the distributions of resistance values that vary due to the fluctuation phenomenon within the ranges of 1$\sigma$, 2$\sigma$, 3$\sigma$, and 4$\sigma$ are represented by error bars with a white circle, a white triangle, a white square, and a white rhombus, respectively.

The chart indicates that in the low resistance state, the influence of the fluctuations is very subtle even with consideration of the distributions up to 4$\sigma$, and the resistance value of the nonvolatile storage element hardly changes. On the other hand, the chart indicates that it is highly likely that the resistance value of the nonvolatile storage element in the high resistance state significantly changes due to the strong influence of the fluctuations.

Assuming that a determination point for determining one of the high resistance state and the low resistance state (determination resistance value or resistance reference level Rref) is set to 27.5 k$\Omega$ that is a median value (average value) between 50 k$\Omega$ and 5 k$\Omega$ (that is, determining that the nonvolatile storage element is in the high resistance state when the determination resistance value is higher than the median value, and that the nonvolatile storage element is in the low resistance state when the determination resistance value is lower than the median value), it is wrongly determined with a higher probability that the nonvolatile storage element in the high resistance state is in the low resistance state. As shown in FIG. 8, one of the ends of the error bar of 2$\sigma$ in the high resistance state crosses the line representing the median value. This indicates that approximately 2.28% of the nonvolatile storage elements that are set to the high resistance state (50 k$\Omega$) are wrongly determined to be in the low resistance state. However, if the determination resistance value is set closer to the low resistance state (5 k$\Omega$), the probability of wrong determination significantly decreases. For example, when 8 k$\Omega$ is defined as the determination resistance value, the determination resistance value does not cross the error bar representing 4$\sigma$. Thus, the probability of wrongly determining a resistance value becomes lower than or equal to 0.0032%. In other words, setting the determination resistance value to a value closer to a value in the low resistance state makes it possible to set the probability of wrong determination in reading data to approximately 1/1000.

The results show that the determination resistance value (resistance reference level Rref) for differentiating between the high resistance state and the low resistance state needs to be set to a resistance value closer to the one in the low resistance state as much as possible than a median value between the resistance value in the high resistance state and the resistance value in the low resistance state, in order to reduce the probability of having an error in reading data due to the fluctuations in resistance value of the variable resistance nonvolatile storage elements. The determination point for a resistance value is normally set to a median value between a resistance value in the high resistance state and a resistance value in the low resistance state in many cases to minimize the influence of variation in set current values that is caused by the element variation or setting variation in resistance value. In other words, the determination point is set to the median value based on the idea that the resistance values vary similarly in the high resistance state and the low resistance state. However, in consideration of the fluctuation phenomenon of the resistance values, the determination point of a resistance value (that is, resistance reference level Rref) is desirably set closer to the resistance value in the low resistance state than the median value between the resistance value in the high resistance state and the resistance value in the low resistance state.

As described above, it is clear that the following method is preferable as a method for reading data from a variable resistance nonvolatile storage element. More specifically, the preferable method for reading data from a variable resistance nonvolatile storage element having characteristics in which a resistance state between the first electrode and the second electrode with application of a voltage having a first polarity (for example, negative polarity) between the first electrode and the second electrode becomes a first resistance state (that is, resistance value RL in a low resistance state), and in which the resistance state between the first electrode and the second electrode with application of a voltage having a second polarity (for example, positive polarity) different from the first polarity between the first electrode and the second electrode becomes a second resistance state (that is, resistance value RH (>RL) in a high resistance state) includes: detecting a resistance value of the nonvolatile storage element; and determining that (i) the nonvolatile storage element is in the low resistance state when the resistance value detected in the detecting is smaller than a resistance reference level Rref, and (ii) the nonvolatile storage element is in the high resistance state when the resistance value detected in the detecting is larger than the resistance reference level Rref, the resistance reference level Rref being defined as a state that is closer to a resistance value in the low resistance state than a median value between the low resistance state and the high resistance state (for example, RL<Rref<(RL+RH)/2), Accordingly, even when the nonvolatile storage element in the second resistance state has characteristics (fluctuations) of having random change in the resistance value with the passage of time, the error in reading data that is caused by the fluctuations in resistance value of the nonvolatile storage element is avoided and consequently, the information holding capability of the nonvolatile storage element is improved.

Here, the specific method for determining the resistance reference level Rref may be, for example, to measure the fluctuations of the resistance value RH of the nonvolatile storage element in the high resistance state beforehand and determine, as the resistance reference level Rref, a reference resistance value with which the resistance value RH within the range of 4σ in the distribution of the fluctuation is determined to be in the high resistance state (that is, resistance value smaller than the average value of the fluctuated resistance values RH by 4σ). In other words, in the determining, a resistance value smaller than an average value of the fluctuations by at least 4σ is preferably determined as the resistance reference level Rref satisfying RL<Rref<(RL+RH)/2, where σ denotes a standard deviation in the fluctuations of the resistance value of the nonvolatile storage element in the second resistance state RH.

The specific method for determining RH and RL in RL<Rref<(RL+RH)/2 for defining the range of the resistance reference level Rref may be described below as an example:

Prepare a memory cell array including a plurality of nonvolatile storage elements beforehand to be described later in Embodiment 3, and calculate a fluctuation of the resistance values RH of the memory cell array in the high resistance state (distribution of resistance values) and a fluctuation of the resistance values RL of the memory cell array in the low resistance state (distribution of resistance values). Then, determine representative values RH and RL in each of the distributions, and use these values as RH and RL for defining the range of the resistance reference level Rref.

The methods for determining the representative values include (1) determining an average value of each of the distributions as a representative value, (2) representing each distribution by frequency distribution (using a horizontal axis as a resistance value and a vertical axis as a frequency) and determining a resistance value that peaks in the frequency distribution as a representative value, and (3) representing each distribution by arranging resistance values (ascending order of the resistance values) and determining a resistance value to be a median in the arrangement as a representative value.

Although Embodiment 1 describes a variable resistance nonvolatile storage element comprising a Ta oxide in the variable resistance layer, the variable resistance nonvolatile storage element is not limited to such. Embodiment 1 is applicable to a nonvolatile storage element having the variation phenomenon in resistance value for a short period of time. For example, it is possible to reduce the probability of error in reading data by determining the determination resistance value, for the nonvolatile storage element comprising an Ni oxide in the variable resistance layer as reported in NPL 1.

As described above, the resistance change phenomenon in the variable resistance layer having a stacked structure presumably occurs when the resistance value of the variable resistance layer changes by an oxidation-reduction reaction in a tiny filament formed in the second transition metal oxide layer 105 having high resistance. Thus, the fluctuation phenomenon found by the Inventors this time presumably occurs because the conduction state in the tiny filament changes due to some influences. More specifically, it is likely that the fluctuations occur due to imperfectly bonding or dissociating oxygen atoms. Furthermore, it is likely that electric potentials change and the resistance state fluctuates because electrons are captured or ejected in a dangling bond in the tiny filament. Thus, whether the first transition metal included in the first transition metal oxide layer 104 and the second transition metal included in the second transition metal oxide layer 105 are identical to or different from each other in a variable resistance element having a structure in which the resistance value increases or decreases according to the resistance state of the tiny filament, it is assumed that the fluctuation phenomenon essentially occurs at various degrees. Determining the determination resistance value (resistance reference level) for the variable resistance nonvolatile storage element having such fluctuations enables reduction in the probability of error in reading data.

Figure 9:
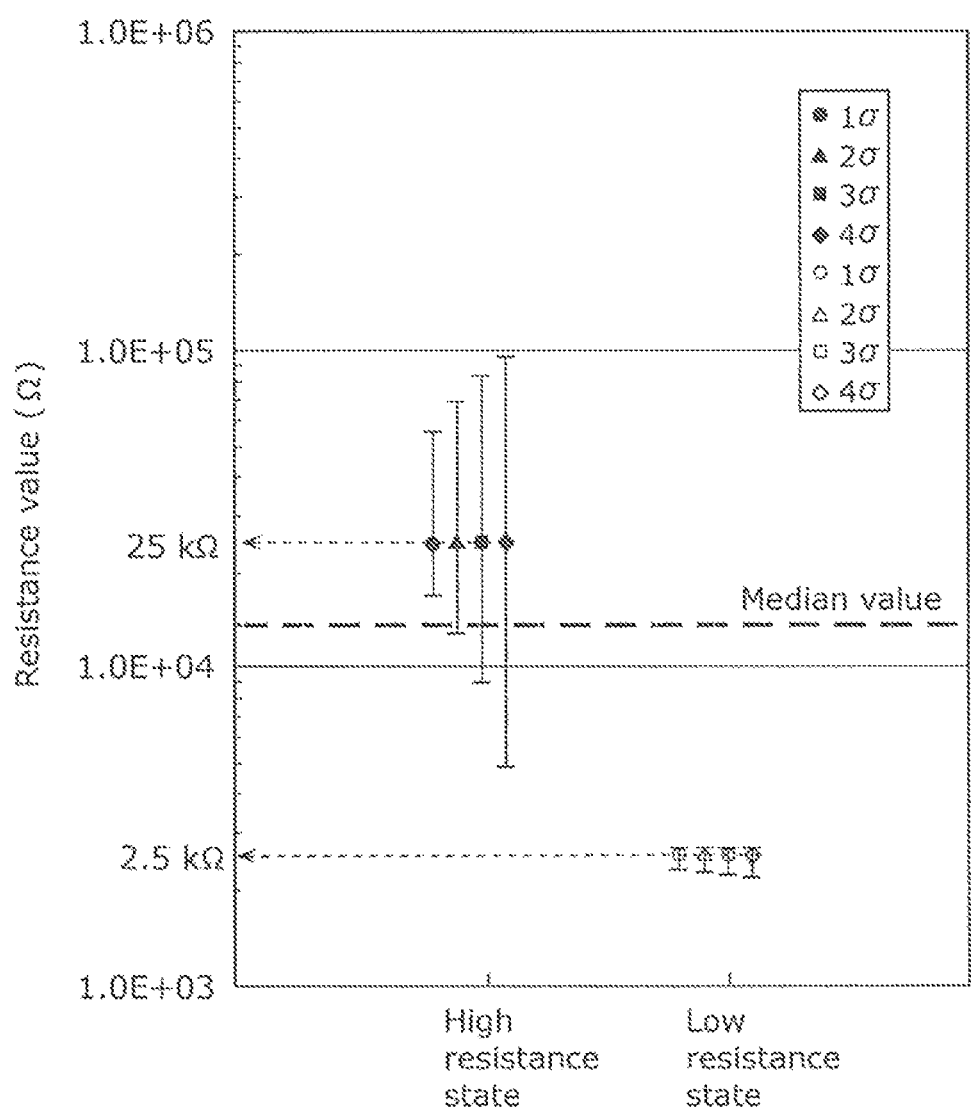
FIG. 9 is a diagram for describing the influence of a resistance variation phenomenon of a nonvolatile storage element according to Embodiment 1.
Figure 10:
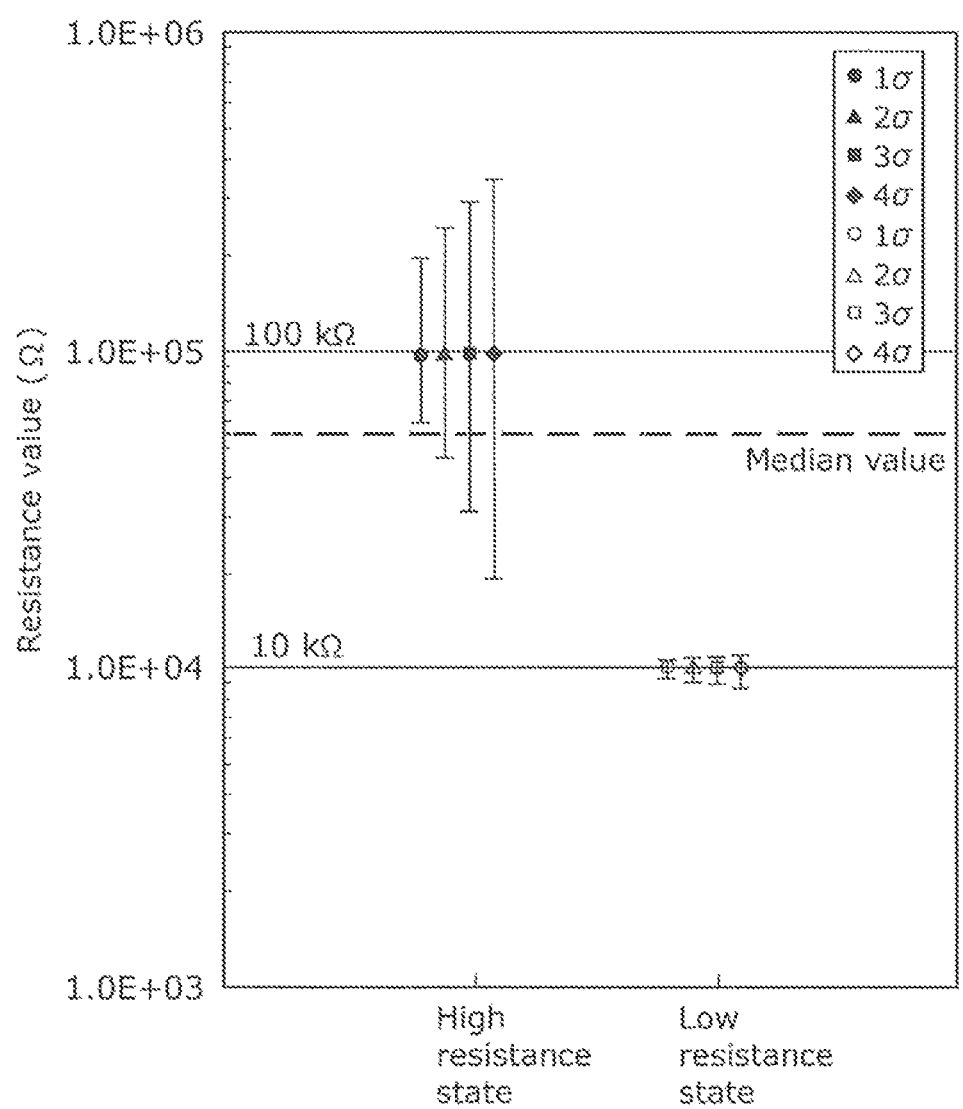
FIG. 10 is a diagram for describing the influence of a resistance variation phenomenon of a nonvolatile storage device according to Embodiment 1.

Furthermore, although Embodiment 1 describes a case where the resistance value in the low resistance state is set to 5 kΩ and the resistance value in the high resistance state is set to 50 kΩ, the set resistance value may be others. For example, FIG. 9 shows the case where the resistance value in the low resistance state is set to 2.5 kΩ and the resistance value in the high resistance state is set to 25 kΩ, and FIG. 10 shows the case where the resistance value in the low resistance state is set to 10 kΩ and the resistance value in the high resistance state is set to 100 kΩ. In both of the cases, setting the determination point between the resistance value in the low resistance state and the resistance value in the high resistance state shows that it is highly likely that the operation for reading data is significantly susceptible to the fluctuations. Specifically, in both of the cases, setting the determination point (resistance reference level Rref) to a value closer to the resistance value in the low resistance state than the median value between the resistance value in the low resistance state and the resistance value in the high resistance state makes it possible to reduce the error in reading data that is caused by the influence of fluctuations.

Furthermore, although the influence of the resistance variations on set resistance values was evaluated by (i) changing the values of the load resistors connected to the nonvolatile storage elements, (ii) obtaining data of the resistance variations in the set resistance values in a wide range for a short period of time, and (iii) evaluating the distribution of the data according to Embodiment 1, the method is not limited to such. For example, the method may include measuring, several times, the resistance variations in resistance value for a short period of time under fixed conditions of the load resistors, statistically processing the data, and evaluating the influence of the resistance variations on the set resistance values for a short period of time.

Embodiment 2

Embodiment 1 describes how to set a determination point of a resistance value to reduce the influence of the fluctuation phenomenon, when a state of a variable resistance nonvolatile storage element is determined to be one of a low resistance state and a high resistance state according to a magnitude of the resistance value. Embodiment 2 will describe a case where the state is determined according to a magnitude of a current that flows through the nonvolatile storage element.

Embodiment 2 applies the nonvolatile storage element used for studying the fluctuation phenomenon in resistance value of the nonvolatile storage element and the operations for studying the influence of the fluctuations on the set resistance value that are described in Embodiment 1. In other words, the nonvolatile storage element used is a nonvolatile storage element including, on a substrate 101 that is a single-crystal silicon, an oxide layer 102 having a thickness of 200 nm, a lower electrode 103 comprising TaN and having a thickness of 40 nm, a first oxygen-deficient Ta oxide layer 104 having a thickness of 45 nm, a second oxygen-deficient Ta oxide layer 105 having a thickness of 5.5 nm, and an upper electrode 107 comprising Ir and having a thickness of 50 nm. Various load resistors were connected to the nonvolatile storage element, voltages of +2.5V and −2.0V were applied to the nonvolatile storage element to cause the resistance change, and the resistance state of the nonvolatile storage element was set to the high resistance state and the low resistance state. Then, the variation in resistance value of the nonvolatile storage element for a short period of time was measured at a room temperature, and a relationship between the variation and the set resistance value was determined as shown in FIGS. 4 and 5. Next, the distribution of the resistance values was determined, and distribution curves of the resistance values were determined as shown in FIG. 7.

Next, the relationship in FIG. 7 was expressed in terms of current. Here, assuming the actual use of the nonvolatile storage element, the relationship was calculated using the load resistor of 5 kΩ. Here, the reason why the load resistor of 5 kΩ was used is because of assumption that an ON resistance value of a transistor becomes approximately 5 kΩ under, for example, the 1T1R structure in which one nonvolatile storage element is connected to one transistor (actually, a transistor having such an ON resistance value can be easily formed). Furthermore, the voltage for reading data was 50 mV. In such a case, a value of a current that flows through the nonvolatile storage element can be calculated by the following equation. In other words, when R denotes a resistance value of the nonvolatile storage element, the current I that flows through the nonvolatile storage element can be calculated by:

$$I=0.050/(R+5000)(A) \quad (3).$$

Figure 11:
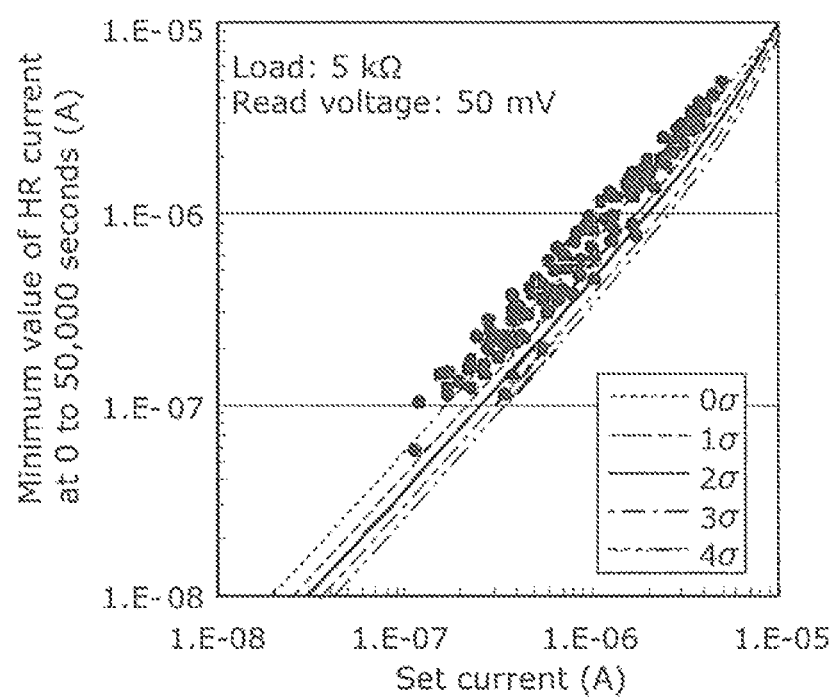
FIG. 11 shows the plotted minimum values of variation in current value of a nonvolatile storage element in the high resistance state according to Embodiment 2 in the present invention.

FIG. 11 shows the result obtained by converting the resistance values in FIG. 7 into current values using the equation (3). The influence of the fluctuation when the minimum values of the resistance values in the high resistance state and the maximum values and the minimum values of the resistance values in the low resistance state are converted to current values was also calculated using the similar procedure (not shown in the drawings).

Figure 12:
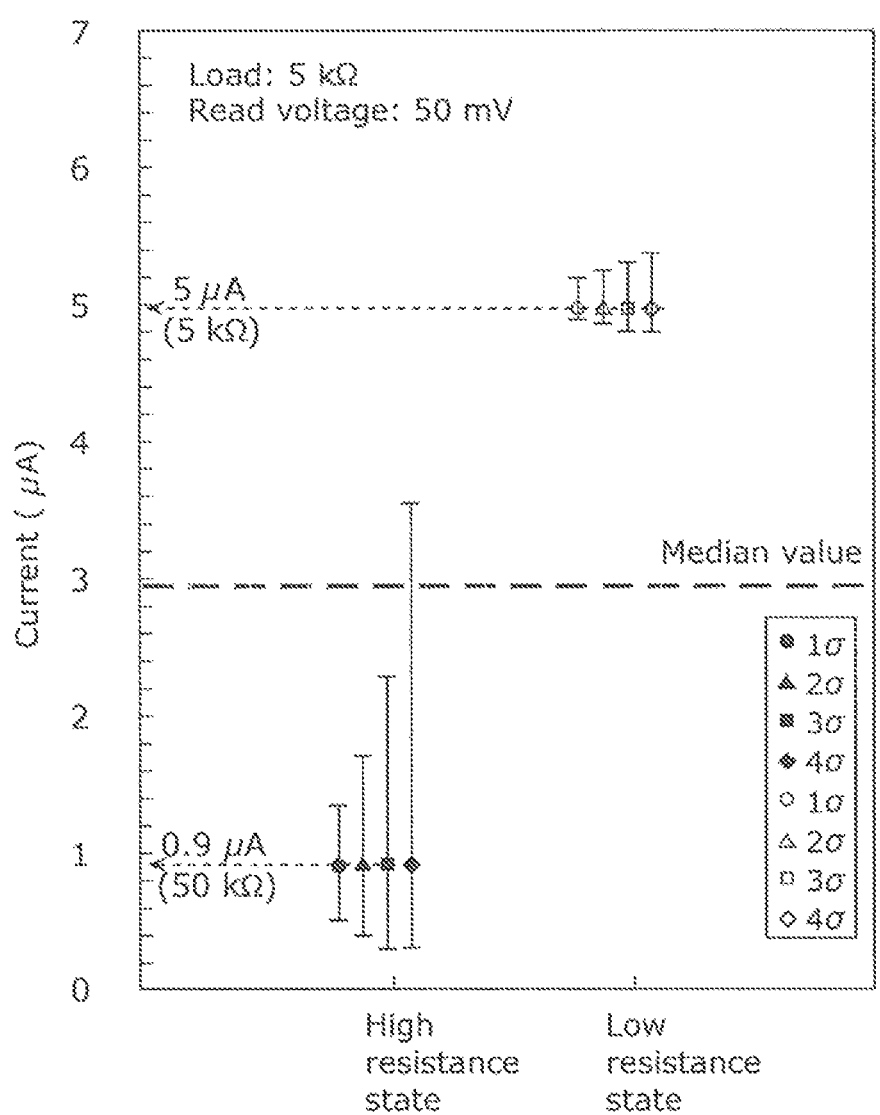
FIG. 12 is a diagram for describing the influence of a resistance variation phenomenon of a nonvolatile storage element according to Embodiment 2.

FIG. 12 shows an easy-to-understand summary of the influence of fluctuations when the resistance values are converted to current values using these results of calculation. Here, the set current value in the high resistance state was 0.9 µA (corresponding to a resistance value of 50 kΩ), and the set current value in the low resistance state was 5 µA (corresponding to a resistance value of 5 kΩ). FIG. 12 shows that even when the resistance values are converted to current values, the influence of the fluctuations appears more strongly in the high resistance state than the low resistance state. In other words, it is highly likely that the current values of the nonvolatile storage element significantly vary in the high resistance state due to the fluctuations. For example, when the determination point (that is, current reference level Iref) of a current value is set to a median value between the set current value in the low resistance state and the set current value in the high resistance state, the line indicating the median value (2.95 µA) crosses the error bar indicating the distribution of 4σ in the high resistance state. Thus, the probability with which the current value in the high resistance state exceeds the determination point (probability of wrongly determining the nonvolatile storage element in the high resistance state to be in the low resistance state) ranges approximately between 0.0032 and 0.14%. However, setting the determination point of the current value to, for example, 3.6 µA enables reduction of the probability of wrongly determining data to less than 0.0032%. Conversely, setting the determination point of the current value to 2 µA increases the probability of wrongly determining data to more than 0.14%. Thus, the determination point of the current value is desirably set to a value closer to the current value in the low resistance state as much as possible than the median value between the current value in the low resistance state and the current value in the high resistance state.

When one of the high resistance state and the low resistance state is determined using the current that flows through the nonvolatile storage element, the determination point of the current value is normally set to the median value between the current value in the low resistance state and the current value in the high resistance state in many cases to minimize the influence of variation in set current values that is caused by the element variation or setting variation in resistance value. However, in consideration of the fluctuation phenomenon of the resistance values as described above, the determination point of a current value (current reference level Iref) is desirably set closer to the current value in the low resistance state than the median value between the current value in the high resistance state and the current value in the low resistance state.

The fact that the probability of wrong determination using the determination method according to Embodiment 2 is lower than that according to Embodiment 1 will be described hereinafter. In other words, the fact that the method for determining whether a nonvolatile storage element is in one of the low resistance state and the high resistance state using a current that flows through the nonvolatile storage element with application of a fixed voltage (Embodiment 2) is more preferable than that using a resistance value of the nonvolatile storage element (Embodiment 1) in view of the probability of wrong determination will be described hereinafter.

When the resistance state (high resistance state or low resistance state) of a nonvolatile storage element is determined using the resistance value (Embodiment 1), the resistance reference level Rref is defined by an equation of (RL+RH)/2 as a median value between a resistance value in the high resistance state and a resistance value in the low resistance state. In the example shown in FIG. 8, the error bars of $2\sigma$, $3\sigma$, and $4\sigma$ in the high resistance state cross the line representing the median value (that is, the nonvolatile storage element in the high resistance state may be wrongly determined to be in the low resistance state).

When the resistance state (high resistance state or low resistance state) of a nonvolatile storage element is determined using a current that flows through the nonvolatile storage element with application of a fixed voltage (Embodiment 2), the current reference level Iref is defined by an equation of (IRL+IRH)/2 as a median value between a current value in the high resistance state and a current value in the low resistance state. In the example shown in FIG. 12, only the error bar of $4\sigma$ in the high resistance state crosses the line representing the median value (that is, the nonvolatile storage element in the high resistance state may be wrongly determined to be in the low resistance state).

As described above, as a result of the comparison between FIGS. 8 and 12, when a median value between the high resistance state and the low resistance state is defined as a reference level, the probability of wrong determination decreases more with the method for determining the resistance state of the nonvolatile storage element using the current that flows through the nonvolatile storage element than with the method using the resistance value.

The reason will be described in detail hereinafter.

When the resistance state of the nonvolatile storage element is determined using a resistance value, the median value expressed by (RL+RH)/2 serves as a measure for the resistance reference level Rref. Here, as indicated by the equation of (RL+RH)/2, the resistance value RH in the high resistance state dominantly determines a median value. When the resistance state of the nonvolatile storage element is determined using a current value of a current that flows through the nonvolatile storage element, the median value expressed by (IRL+IRH)/2 serves as a measure for the current reference level Iref. Here, as indicated by the equation of (IRL+IRH)/2, the current value IRL in the low resistance state dominantly determines a median value.

For example, consider a case where the resistance value RH in the high resistance state and the resistance value RL in the low resistance state satisfy a relationship of RH=10×RL (that is, IRL=10×IRH). Here, the resistance value RH in the high resistance state having a larger fluctuation has a margin expressed by RH:(RL+RH)/2=10:5.5 (approximately double) with respect to the median value expressed by (RL+RH)/2. On the other hand, the current value IRH in the high resistance state having a larger fluctuation has a margin expressed by IRH:(IRL+IRH)/2=1:5.5 (approximately 5 to 6 times) with respect to the median value expressed by (IRL+IRH)/2. Thus, the latter has a sufficient margin for the fluctuation.

Thus, the probability of wrong determination decreases more with the method for determining the resistance state of the nonvolatile storage element using the current that flows through the nonvolatile storage element (that is, defining the current reference level Iref using the median value (IRL+IRH)/2 as a measure) than with the method using the resistance value (that is, defining the resistance reference level Rref using the median value (RL+RH)/2 as a measure).

As described above, it is clear that the following method is preferable as a method for reading data from a variable resistance nonvolatile storage element. More specifically, the preferable method for reading data from a variable resistance nonvolatile storage element having characteristics in which a resistance state between the first electrode and the second electrode with application of a voltage having a first polarity (for example, negative polarity) between the first electrode and the second electrode becomes a first resistance state (that is, resistance value RL in a low resistance state), and in which the resistance state between the first electrode and the second electrode with application of a voltage having a second polarity (for example, positive polarity) different from the first polarity between the first electrode and the second electrode becomes a second resistance state (that is, resistance value RH (>RL) in a high resistance state) includes: detecting a current that flows through the nonvolatile storage element with application of a fixed voltage; and determining that (i) the nonvolatile storage element is in the high resistance state when the current detected in the detecting is smaller than a current reference level Iref, and (ii) the nonvolatile storage element is in the low resistance state when the current detected in the detecting is larger than the reference level Iref, the current reference level Iref being defined by (IRL+IRH)/2<Iref<IRL, where IRL denotes a current that flows through the nonvolatile storage element in the first resistance state with application of the fixed voltage, IRH denotes a current that flows through the nonvolatile storage element in the second resistance state, and IRH<IRL. Accordingly, even when the nonvolatile storage element in the second resistance state has characteristics (fluctuations) of having random change in the resistance value with the passage of time, the error in reading data that is caused by the fluctuations in resistance value of the nonvolatile storage element is avoided and consequently, the information holding capability of the nonvolatile storage element is improved.

Here, the specific method for determining the current reference level Iref is, for example, to measure the fluctuations of the current value IRH of the nonvolatile storage element in the high resistance state beforehand and determine, as the current reference level Iref, a reference current value with which the current value IRH within the range of $4\sigma$ in the distribution of the fluctuations determines that the nonvolatile storage element is in the high resistance state (that is, current value larger than the average value of the fluctuated current values IRH by $4\sigma$). In other words, in the determining, a current value larger than an average value of the fluctuations by at least $4\sigma$ is preferably determined as the current reference level Iref satisfying (IRL+IRH)/2<Iref<IRL, where $\sigma$ denotes a standard deviation in the fluctuations of the current value IRH of the nonvolatile storage element in the second resistance state RH.

The specific method for determining IRH and IRL in (IRL+IRH)/2<Iref<IRL for defining the range of the current reference level Iref may be described below as an example:

Prepare a memory cell array including a plurality of nonvolatile storage elements beforehand to be described later in Embodiment 3, and calculate a fluctuation of the current value IRH of the memory cell array in the high resistance state (distribution of current values) and a fluctuation of the current value IRL of the memory cell array in the low resistance state (distribution of current values). Then, determine representative values IRH and IRL in each of the distributions, and use these values as IRH and IRL for defining the range of the current reference level Iref.

The methods for determining the representative values include (1) determining an average value in each distribution as a representative value, (2) representing each distribution by frequency distribution (using a horizontal axis as a resistance value and a vertical axis as a frequency) and determining a current value that peaks in the frequency distribution as a representative value, and (3) representing each distribution by arranging current values (ascending order of the current values) and determining a current value to be a median in the arrangement as a representative value.

The above case assumes a state in which a load resistor of 5 k$\Omega$ is connected to the nonvolatile storage element and the read voltage (fixed application voltage for detecting a current value) is 50 mV. However, these values are set as examples, and values other than these values sufficiently produce the advantage of reducing the occurrence of an error in reading data that is caused by the fluctuations.

Figure 13:
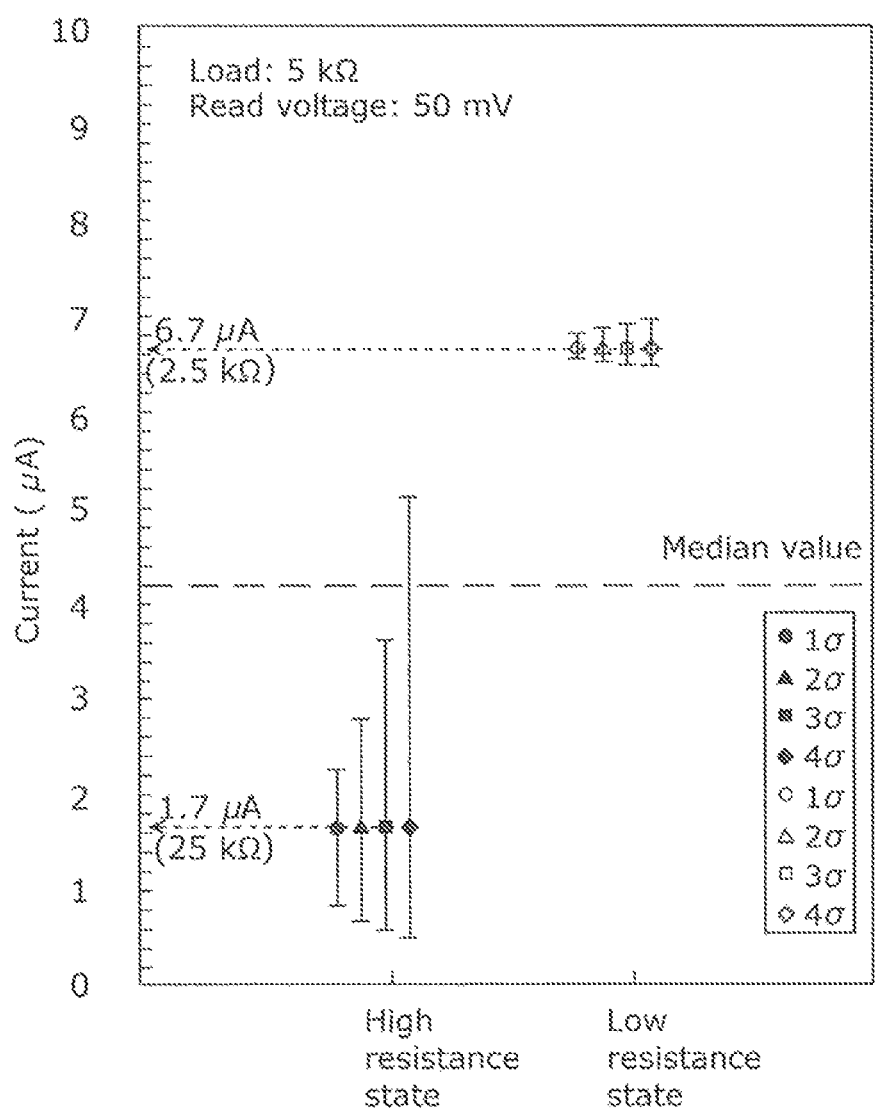
FIG. 13 is a diagram for describing the influence of a resistance variation phenomenon of a nonvolatile storage element according to Embodiment 2.
Figure 14:
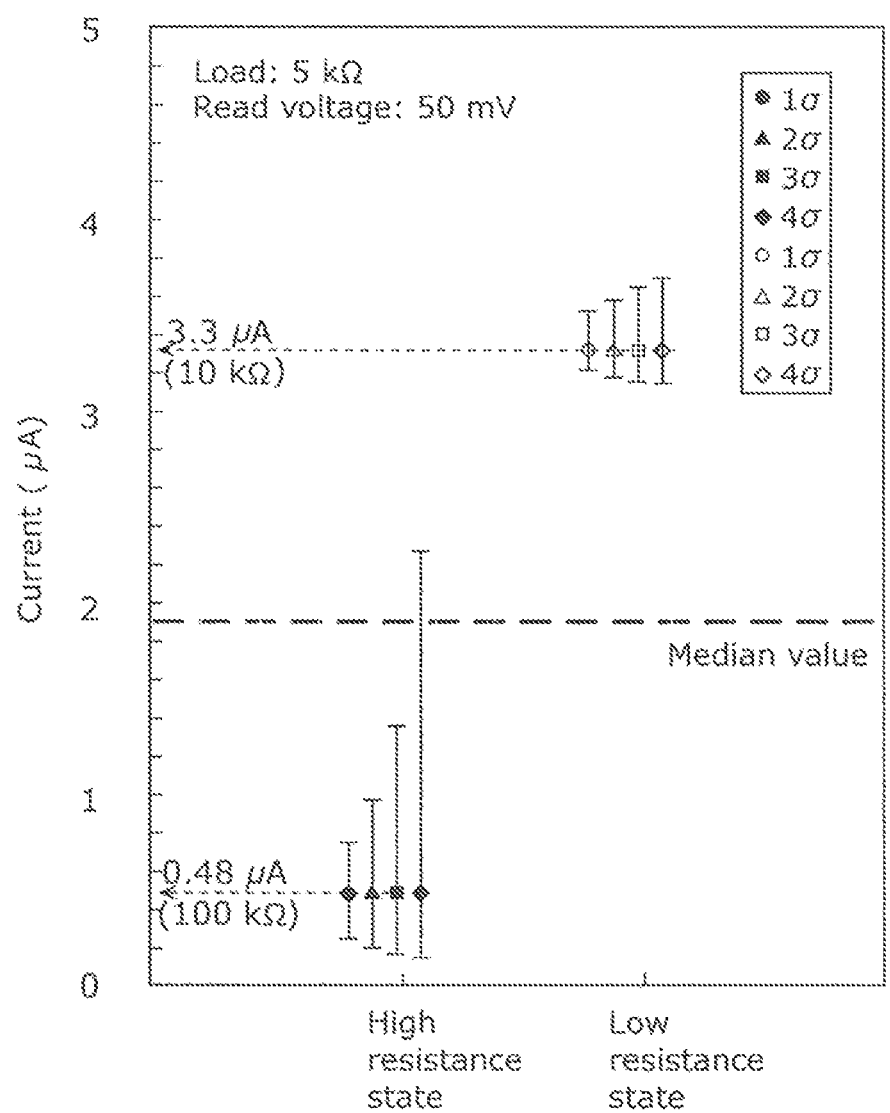
FIG. 14 is a diagram for describing the influence of a resistance variation phenomenon of a nonvolatile storage element according to Embodiment 2.

Although the example above is described in detail with the setting of the current value in the high resistance state to 0.9 $\mu$A and the current value in the low resistance state to 5 $\mu$A in addition to the connection to the load resistor of 5 k$\Omega$, the set current values are not limited to such. For example, FIG. 13 shows a case where the current value in the low resistance state is set to 6.7 $\mu$A and the current value in the high resistance state is set to 1.7 $\mu$A and FIG. 14 shows a case where the current value in the low resistance state is set to 3.3 $\mu$A and the current value in the high resistance state is set to 0.48 $\mu$A. Both of the cases show that the influence of the fluctuations is probably very large when the determination point is set between the current value in the low resistance state and the current value in the high resistance state. Thus, setting the determination point to a value closer to the current value in the low resistance state than the median value enables reduction in the error in reading data that is cased by the influence of fluctuations.

Embodiment 3

Next, Embodiment 3 will describe an example of a nonvolatile storage device according to the present invention, that is, a 1T1R nonvolatile storage device.

[Structure of Nonvolatile Storage Device]

Figure 15:
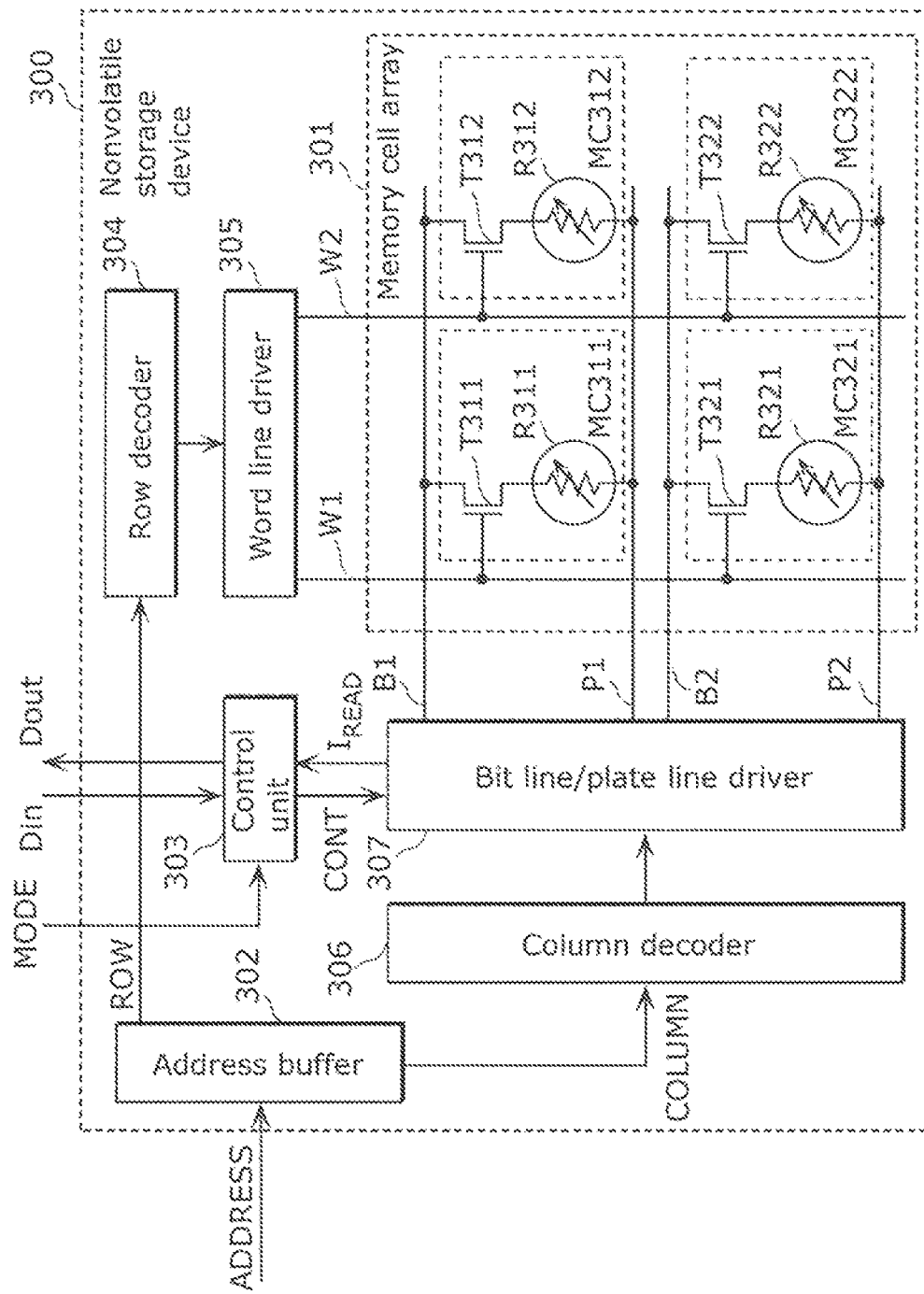
FIG. 15 is a block diagram illustrating an example configuration of a nonvolatile storage device according to Embodiment 3 in the present invention.

FIG. 15 is a block diagram illustrating an example configuration of a nonvolatile storage device 300 according to Embodiment 3 in the present invention. As illustrated in FIG. 15, the nonvolatile storage device 300 includes a memory cell array 301 including nonvolatile storage elements R311 to R322, an address buffer 302, a control unit 303, a row decoder 304, a word line driver 305, a column decoder 306, and a bit line/plate line driver 307. Furthermore, the bit line/plate line driver 307 includes a sensing circuit (sense amplifier) capable of measuring (calculating) a current flowing through a bit line or a plate line, a voltage generated, or a resistance value calculated from the current and the voltage.

As illustrated in FIG. 15, the memory cell array 301 includes: two word lines W1 and W2 that extend vertically; two bit lines B1 and B2 that extend horizontally and intersect with the word lines W1 and W2; two plate lines P1 and P2 that extend horizontally and correspond to the bit lines B1 and B2, respectively; and four memory cells MC311, MC312, MC321, and MC322 that are arranged in a matrix and correspond to intersections of the word lines W1 and W2 and the bit lines B1 and B2. The memory cells MC311, MC312, MC321, and MC322 include a selection transistor T311 and a nonvolatile storage element R311, a selection transistor T312 and a nonvolatile storage element R312, a selection transistor T321 and a nonvolatile storage element R321, and a selection transistor T322 and a nonvolatile storage element R322, respectively.

The number of each of the constituent elements is not limited to the above. Although the memory cell array 301 includes, for example, the four memory cells MC311, MC312, MC321, and MC322, it may include five or more memory cells.

In the example configuration, although the plate lines are arranged in parallel with the bit lines, the plate lines may be arranged in parallel with the word lines. Furthermore, although the plate lines provide the connected transistors with a common potential, the plate lines may include a source line selection circuit or a driver having the same configuration as those of the row decoder 304 and the word line driver 305, and drive a selected source line and a non-selected source line with different voltages (including polarities).

Each of the nonvolatile storage elements R311, R312, R321, and R322 corresponds to the nonvolatile storage elements 100 and 201 described in Embodiments 1 and 2. Additionally, in the configuration of the memory cell array 301, the memory cell MC311 (selection transistor T311 and nonvolatile storage element R311) is between the bit line B1 and the plate line P1. In the memory cell MC311, the source of the selection transistor T311 is connected in series with the nonvolatile storage element R311. More specifically, the selection transistor T311 is connected to the bit line B1 and the nonvolatile storage element R311 in between them, and the nonvolatile storage element R311 is connected to the selection transistor T311 and the plate line P1 in between them. Furthermore, the gate of the selection transistor T311 is connected to the word line W1.

The connection states of the other three selection transistors T312, T321, and T322 and the three nonvolatile storage elements R312, R321, and R322 that are arranged in series with the selection transistors T312, T321, and T322, respectively are the same as that of the selection transistor T311 and the nonvolatile storage element R311, and thus the description is omitted.

With the above configuration, when a predetermined voltage (activation voltage) is applied to gates of the selection transistors T311, T312, T321, and T322 via the word lines W1 and W2, conduction between a drain and a source of each of the selection transistors T311, T312, T321, and T322 is achieved.

The address buffer 302 receives an address signal ADDRESS from an external circuit (not shown), and then, based on the received address signal ADDRESS, provides a row address signal ROW to the row decoder 304 and a column address signal COLUMN to the column decoder 306. Here, the address signal ADDRESS indicates an address of a memory cell selected from among the memory cells MC311, MC312, MC321, and MC322. In addition, the row address signal ROW indicates an address of a row from among the addresses indicated by the address signals ADDRESS. Similarly, the column address signal COLUMN indicates an address of a column.

The control unit 303 selects one of a write mode, an erase mode, and a read mode, based on a mode selection signal MODE received from the external circuit, and performs control corresponding to the selected mode. According to Embodiment 3, the write mode is a mode in which a nonvolatile storage element is set to the low resistance state, the erase mode is a mode in which a nonvolatile storage element is set to the high resistance state, and the read mode is a mode in which data is read from a nonvolatile storage element (resistance state of the nonvolatile storage element is determined). Here, each voltage is applied with respect to a potential of a plate line.

Furthermore, in the write mode, the control unit 303 issues a control signal CONT instructing to "apply a write voltage" to the bit line/plate line driver 307, in response to input data Din received from the external circuit.

Furthermore, in the read mode, the control unit 303 issues, to the bit line/plate line driver 307, a control signal CONT instructing to "apply a read voltage". The control unit 303 further receives, in the read mode, a signal $I_{READ}$ from the bit line/plate line driver 307 (detecting), and provides the external circuit with output data Dout indicating a bit value corresponding to the signal $I_{READ}$ (determining). The signal $I_{READ}$ indicates a current value of a current that flows through the plate lines P1 and P2 in the read mode.

In the erase mode, the control unit 303 provides a control signal CONT instructing to "apply an erase voltage", to the bit line/plate line driver 307.

The row decoder 304 receives the row address signal ROW provided by the address buffer 302, and based on the row address signal ROW, selects one of the two word lines W1 and W2. Based on the output signal of the row decoder 304, the word line driver 305 applies an activation voltage to the word line selected by the row decoder 304.

The column decoder 306 receives the column address signal COLUMN output from the address buffer 302, and based on the column address signal COLUMN, selects one of the two bit lines B1 and B2 and also selects one of the two plate lines P1 and P2 corresponding to the selected bit line.

Upon receipt of the control signal CONT instructing to "apply a write voltage" from the control unit 303, the bit line/plate line driver 307 applies, based on an output signal from the column decoder 306, a write voltage $V_{WRITE}$ (writing voltage puke) between the bit line and the plate line that are selected by the column decoder 306.

Furthermore, upon receipt of the control signal CONT instructing to "apply a read voltage" from the control unit 303, the bit line/plate line driver 307 similarly applies, based on an output signal from the column decoder 306, a read voltage $V_{READ}$ between the bit line and the plate line that are selected by the column decoder 306. Then, the bit line/plate line driver 307 provides the control unit 303 with the signal $I_{READ}$ indicating the current value of a current that flows through the plate line.

Furthermore, upon receipt of the control signal CONT instructing to "apply an erase voltage" from the control unit 303, the bit line/plate line driver 307 applies, based on an output signal from the column decoder 306, an erase voltage $V_{RESET}$ (erasing voltage pulse) between the bit line and the plate line that are selected by the column decoder 306.

Here, the voltage value of the write voltage $V_{WRITE}$ is set, for example, to −2.4 V with the pulse width of 100 ns. Furthermore, the voltage value of the read voltage $V_{READ}$ is set, for example, to +0.4 V. Furthermore, the voltage value of the erase voltage $V_{RESET}$ is set, for example, to +1.8 V with the pulse width of 100 ns.

Operations of Nonvolatile Storage Device

The following will describe example operations of the nonvolatile storage device 300 with the configuration, for each of the write mode, the erase mode, and the read mode.

In the following description, when the nonvolatile storage element is in the low resistance state, the input data Din that the control unit 303 receives from the external circuit is represented by "1". Furthermore, when the nonvolatile storage element is in the high resistance state, the input data Din is represented by "0".

The address signal ADDRESS is assumed to be a signal indicating an address of the memory cell MC311 for the sake of convenience.

[Write Mode]

The control unit 303 receives the input data Din from the external circuit. Here, the control unit 303 issues a control signal CONT instructing to "apply a write voltage", to the bit line/plate line driver 307 when the input data Din indicates "1". On the other hand, the control unit 303 does not issue the control signal CONT when the input data Din indicates "0".

Upon receipt of the control signal CONT instructing to "apply a write voltage" from the control unit 303, the bit line/plate line driver 307 applies a voltage $V_{WRITE}$ (writing voltage pulse) between the bit line B1 and the plate line P1 that are selected by the column decoder 306.

Here, the word line driver 305 applies an activation voltage to the word line W1 selected by the row decoder 304. Thus, conduction between the drain and the source of the selection transistor T311 is achieved.

As a result, the write voltage $V_{WRITE}$, that is, the writing voltage pulse whose voltage value is −2.4 V with the pulse width of 100 ns is output to the plate line with respect to the bit line, and is applied to the memory cell MC311. Accordingly, a pulse voltage applying unit performs a write process, which causes the resistance state of the nonvolatile storage element R311 in the memory cell MC311 to change from the high resistance state to the low resistance state. On the other hand, the writing voltage pulse is not applied to the memory cells MC321 and MC322 and the activation voltage is not applied to the gate of the selection transistor T312 of the memory cell MC312. Thus, the resistance states of the nonvolatile storage elements included in the memory cells MC312, MC321, and MC322 do not change.

As described above, it is possible to change only the nonvolatile storage element R311 into the low resistance state. Thus, the data indicating "1" corresponding to the low resistance state is written in the memory cell MC311.

When the writing into the memory cell MC311 is completed, a new address signal ADDRESS is provided to the address buffer 302 and the operation of the nonvolatile storage device 300 in the write mode is repeatedly performed on the memory cells other than the memory cell MC311.

[Read Mode]

The control unit 303 issues, to the bit line/plate line driver 307, a control signal CONT instructing to "apply a read voltage".

Upon receipt of the control signal CONT instructing to "apply a read voltage" from the control unit 303, the bit line/plate line driver 307 applies a read voltage $V_{READ}$ between the bit line B1 and the plate line P1 that are selected by the column decoder 306.

Here, the word line driver 305 applies an activation voltage to the word line W1 selected by the row decoder 304. Thus, conduction between the drain and the source of the selection transistor T311 is achieved.

Thus, for example, a measured voltage having a voltage value of +0.4 V serving as the read voltage $V_{READ}$ is output to the plate line with respect to the bit line, and is applied to the memory cell MC311. Accordingly, a read current corresponding to the resistance value of the nonvolatile storage element R311 flows from the bit line B1 to the plate line P1 via the nonvolatile storage element R312. The read voltage $V_{READ}$ is a voltage low enough to have no change in the resistance value of a variable resistance element of a memory cell with application of the voltage to the memory cell.

Since no measured voltage is applied to the memory cells MC321 and MC322 and no activation voltage is applied to the gate of the selection transistor T312 of the memory cell MC312, the current does not flow through the memory cells MC312, MC321, and MC322.

Next, the sense amplifier (not illustrated) connected to the bit lines outputs, to the control unit 303, the signal $I_{READ}$ indicating a current value of the read current that flows through the bit line B1. In other words, the control unit 303 detects the current that flows through a nonvolatile storage element (detecting).

The control unit 303 determines and outputs, to the outside of the nonvolatile storage device 300, the output data Dout corresponding to the current value indicated by the signal $I_{READ}$. For example, when the current value indicated by the signal $I_{READ}$ is equal to the current value of the current that flows when the nonvolatile storage element R311 is in the low resistance state, the control unit 303 provides the output data Dout that indicates "1".

Accordingly, the current corresponding to the resistance value of the nonvolatile storage element R311 of the memory cell MC311 flows only to the memory cell MC311, and then flows from the bit line B1 to the plate line P1. Accordingly, the data indicating "1" is read from the memory cell MC311.

The details of the control procedure in the read mode are shown in (a) of FIG. 16. (a) of FIG. 16 is a flow chart indicating the main procedure for reading data by the control unit 303. First, the control unit 303 detects a current that flows through a nonvolatile storage element by reading the signal (current value) $I_{READ}$ from the bit line/plate line driver 307, as the detecting (S10). Next, the control unit 303 compares, as the determining, the current value $I_{read}$ detected in the detecting of S10 with the current reference level Iref that is defined by (IRL+IRH)/2<Iref<IRL, where IRL denotes the current that flows through the nonvolatile storage element in the low resistance state, and IRH (<IRL) denotes the current that flows through the nonvolatile storage element in the high resistance state (S11). As a result, it is determined that the nonvolatile storage element is in the high resistance state when the current value $I_{read}$ is smaller than the current reference level Iref (S12), and that the nonvolatile storage element is in the low resistance state when the current value $I_{read}$ is larger than the current reference level Iref (S13). When the current value $I_{read}$ is equal to the current reference level Iref, it may be determined that the nonvolatile storage element is in one of the high resistance state and the low resistance state. With the procedure, the resistance state of the nonvolatile storage element can be stably determined, based on the current value of a current that flows through the nonvolatile storage element.

In the example of (a) of FIG. 16, the control unit 303 determines the resistance state of the nonvolatile storage element, based on the current value $I_{read}$ of the current that flows through the nonvolatile storage element with application of a fixed voltage. However, when the signal output from the bit line/plate line driver 307 to the control unit 303 is the signal indicating the resistance value (resistance value $R_{read}$) of the nonvolatile storage element, the resistance state of the nonvolatile storage element may be determined based on the resistance value $R_{read}$. (b) of FIG. 16 is a flow chart indicating the main procedure for reading data by the control unit 303, when the resistance state of a nonvolatile storage element is determined based on the resistance value of the nonvolatile storage element.

First, the control unit 303 detects a resistance value of a nonvolatile storage element by reading a signal (here, resistance value $R_{read}$) from the bit line/plate line driver 307, as the detecting (S20). Next, the control unit 303 compares, as the determining, the resistance value $R_{read}$ detected in the detecting of S20 with the resistance reference level Rref that is defined by RL<Rref<(RL+RH)/2, where RL denotes the resistance value of the nonvolatile storage element in the low resistance state, and RH (>RL) denotes the resistance value of the nonvolatile storage element in the high resistance state (S21). As a result, it is determined that the nonvolatile storage element is in the low resistance state when the resistance value $R_{read}$ is smaller than the resistance reference level Rref (S22), and that the nonvolatile storage element is in the high resistance state when the resistance value $R_{read}$ is larger than the resistance reference level Rref (S23). With the procedure, the resistance state of the nonvolatile storage element can be stably determined, based on the resistance value of the nonvolatile storage element.

Instead of measuring the resistance value of the nonvolatile storage element R311 of the memory cell MC311, a voltage in a process where the voltage pre-charged in the nonvolatile storage element R311 is attenuated with the time constant corresponding to the resistance value of the nonvolatile storage element R311 may be measured.

When the reading from the memory cell MC311 is completed, a new address signal ADDRESS is provided to the address buffer 302 and the operation of the nonvolatile storage device 300 in the read mode is repeatedly performed on the memory cells other than the memory cell MC311.

[Erase Mode]

In the erase mode, the control unit 303 outputs a control signal CONT instructing to "apply an erase voltage", to the bit line/plate line driver 307.

Upon receipt of the control signal CONT instructing to "apply an erase voltage" from the control unit 303, the bit line/plate line driver 307 applies an erase voltage $V_{RESET}$ (erasing voltage pulse) between the bit line B1 and the plate line P1 that are selected by the column decoder 306.

Here, the word line driver 305 applies an activation voltage to the word line W1 selected by the row decoder 304. Thus, conduction between the drain and the source of the selection transistor T311 is achieved.

As a result, the erase voltage $V_{RESET}$, that is, the erasing voltage pulse whose voltage value is +1.8 V with the pulse width of 100 ns is output to the plate line with respect to the bit line, and is applied to the memory cell MC311. Accordingly, a pulse voltage applying unit performs an erase process, which causes the resistance state of the nonvolatile storage element R311 of the memory cell MC311 to change from the low resistance state to the high resistance state. On the other hand, the erasing voltage pulse is not applied to the memory cells MC321 and MC322 and the activation voltage is not applied to the gate of the selection transistor T312 of the memory cell MC312. Thus, the resistance states of the nonvolatile storage elements included in the memory cells MC312, MC321, and MC322 do not change.

Although the control unit 303 performs the detecting and the determining in the read mode according to Embodiment 3, the sense amplifier included in the bit line/plate line driver 307 or the sense amplifier independently provided may perform the detecting or both the detecting and the determining instead of the control unit 303. In other words, the control unit 303 and the sense amplifier may appropriately share processing for the detecting and the determining. Here, although the absolute value of the erase voltage $V_{RESET}$ to be applied to a memory cell is smaller than the absolute value of the write voltage V the transistor in writing data is in a source-follower connection. Since the ON resistance of the transistor in writing the data is higher than that of the transistor in erasing data, the absolute value of the voltage to be applied to the variable resistance element in erasing the data is larger than that in the writing.

Embodiment 4

Next, Embodiment 4 will describe another example of a nonvolatile storage device according to the present invention, that is, a cross-point nonvolatile storage device. Here, the cross-point nonvolatile storage device is a storage device in which active layers are provided at points of intersection (three-dimensional cross-points) of word lines and bit lines.

[Configuration of Nonvolatile Storage Device]

FIG. 17 is a block diagram illustrating an example configuration of a nonvolatile storage device 400 according to Embodiment 4 in the present invention. As illustrated in FIG. 17, the cross-point nonvolatile storage device 400 includes a memory cell array 401 including nonvolatile storage elements R11 to R33, an address buffer 402, a control unit 403, a row decoder 404, a word line driver 405, a column decoder 406, and a bit line driver 407. Furthermore, the bit line driver 407 includes a sensing circuit capable of measuring (calculating) a current flowing through a bit line, a voltage generated, or a resistance value calculated from the current and the voltage.

As illustrated in FIG. 17, the memory cell array 401 includes word lines W1, W2, W3, . . . that extend vertically and are parallel to each other, and bit lines B1, B2, B3, . . . that intersect with the word lines W1, W2, W3, . . . , extend horizontally, and are parallel to each other. Here, the word lines W1, W2, W3, . . . are arranged in a first plane parallel to the main plane of a substrate (not illustrated), and the bit lines B1, B2, B3, . . . are arranged in a second plane positioned above or below the first plane and substantially parallel to the first plane. Thus, the word lines W1, W2, W3, . . . three-dimensionally cross the bit lines B1, B2, B3, . . . , and memory cells MC11, MC12, MC13, MC21, MC22, MC23, MC31, MC32, MC33, . . . (hereinafter referred to as "memory cells MC11, MC12, . . . ") are provided for the corresponding three-dimensional cross-points.

Each of the memory cells MC11, MC12, . . . includes a corresponding one of the nonvolatile storage elements R11, R12, R13, R21, R22, R23, R31, R32, R33, . . . that are connected in series, and a corresponding one of current steering elements D11, D12, D13, D21, D22, D23, D31, D32, and D33, . . . each including, for example, a bidirectional diode. The nonvolatile storage elements R11, R12, R13, R21, R22, R23, R31, R32, R33, . . . are connected to the bit lines B1, B2, B3, . . . , and the current steering elements D11, D12, D13, D21, D22, D23, D31, D32, and D33, . . . are connected to the nonvolatile storage elements and the word lines W1, W2, W3, . . . . The nonvolatile storage elements 100 and 201 according to Embodiments 1 and 2 may be used as the nonvolatile storage elements R11, R12, R13, R21, R22, R23, R31, R32, R33, . . . . Furthermore, a metal insulator metal (MIM) diode, a metal semiconductor metal (MSM) diode, a varistor, or others may be used as the current steering elements D11, D12, D13, D21, D22, D23, D31, D32, and D33, . . . .

The address buffer 402 receives an address signal ADDRESS from an external circuit (not illustrated), and then, based on the received address signal ADDRESS, provides a row address signal ROW to the row decoder 404 and a column address signal COLUMN to the column decoder 406. Here, the address signal ADDRESS indicates an address of a memory cell to be selected from among the memory cells MC12, MC21, . . . . In addition, the row address signal ROW indicates an address of a row from among the addresses indicated by the address signals ADDRESS. Similarly, the column address signal COLUMN indicates an address of a column.

Here, each voltage is applied with respect to the bit line.

The control unit 403 selects one of a write mode, an erase mode, and a read mode, based on a mode selection signal MODE received from the external circuit, and performs control corresponding to the selected mode.

Furthermore, in the write mode and the erase mode, the control unit 403 applies a write voltage pulse and an erasing voltage pulse, respectively, to the word line driver 405, according to input data Din received from the external circuit.

Furthermore, in the read mode, the control unit 403 applies a read voltage to the word line driver 405. The control unit 403 further receives, in the read mode, a signal $I_{READ}$ from the word line driver 405 (detecting), and provides the external circuit with output data Dout indicating a bit value corresponding to the signal $I_{READ}$ (determining). The signal $I_{READ}$ indicates a current value of a current that flows through the word lines W1, W2, W3, . . . in the read mode.

The row decoder 404 receives the row address signal ROW output from the address buffer 402, and based on the row address signal ROW, selects one of the word lines W1, W2, W3, . . . . Based on the output signal received by the row decoder 404, the word line driver 405 applies an activation voltage to the word line selected by the row decoder 404.

The column decoder 406 receives the column address signal COLUMN output from the address buffer 402, and selects one of the bit lines B1, B2, B3, . . . , based on the column address signal COLUMN.

The bit line driver 407 connects the bit line selected by the column decoder 406 to ground, based on the output signal received by the column decoder 406.

Although Embodiment 4 describes a cross-point nonvolatile storage device having a single layer, a cross-point nonvolatile storage device having multiple layers may be employed by stacking memory cell arrays.

In addition, the nonvolatile storage elements and the current steering elements may exchange the positional relationship. More specifically, the bit lines and the word lines may be connected to the nonvolatile storage elements and the current steering elements, respectively.

In addition, one or both of the bit lines and the word lines may also serve as electrodes in the nonvolatile storage elements.

[Operations of Nonvolatile Storage Device]

The following will describe an example operation of the nonvolatile storage device 400 with the configuration, for each of the write mode, the erase mode, and the read mode. Since known methods can be used for selecting a bit line and a word line and for applying a voltage pulse, the detail description is omitted.

In the following example, writing and reading are performed on the memory cell MC22. Since the ON resistance of a current steering element (diode) included in a memory cell is higher than that of a transistor, the voltage to be applied to the memory cell in each of the write mode, the erase mode, and the read mode is higher than that of a memory cell including a transistor.

Write Mode

When data indicating "1" is written (stored) into the memory cell MC22, the bit line driver 407 connects the bit line B2 to ground, and the word line driver 405 electrically connects the word line W2 to the control unit 403. Then, the control unit 403 applies a write voltage pulse to the word line W2. The voltage value of the writing voltage pulse is set to −4.0 V with the pulse width of 100 ns, for example. The writing voltage pulse is a voltage capable of turning ON the current steering element, and is an application voltage serving as a write voltage to set the variable resistance element in the low resistance state.

With the operations, a pulse voltage applying unit performs a write process for applying the writing voltage pulse to the nonvolatile storage element R22 of the memory cell MC22, which causes the nonvolatile storage element R22 in the memory cell MC22 to change to the low resistance state corresponding to "1".

[Erase Mode]

In writing (erasing) data indicating "0" to the memory cell MC22, the bit line driver 407 connects the bit line B2 to ground, and the word line driver 405 electrically connects the word line W2 to the control unit 403. Then, the control unit 403 applies the erasing voltage pulse to the word line W2. Here, for example, the voltage value of the erasing voltage pulse is set to +5.0 V with the pulse width of 100 ns. The erase voltage turns ON the current steering element, and is a voltage having an absolute value larger than that of the write voltage to set the variable resistance element to the high resistance state.

With the operations, a pulse voltage applying unit performs an erase process for applying the erasing voltage pulse to the nonvolatile storage element R22 of the memory cell MC22, which causes the nonvolatile storage element R22 to change to the high resistance state corresponding to "0".

Read Mode

In writing data written to the memory cell MC22, the bit line driver 407 connects the bit line B2 to ground, and the word line driver 405 electrically connects the word line W2 to the control unit 403. Then, the control unit 403 applies a read voltage to the word line W2. Here, for example, the voltage value of the read voltage is set to +2.8 V. The read voltage turns ON the current steering element, and is a read voltage to cause no resistance change to the variable resistance element.

With application of the read voltage to the memory cell MC22, the current having the current value corresponding to the resistance value of the nonvolatile storage element R22 of the memory cell MC22 flows between the bit line B2 and the word line W2. The control unit 403 detects a current value of the current (detecting), and detects the resistance state of memory cell MC22, based on the current value and the read voltage (determining).

When the nonvolatile storage element R22 of the memory cell MC22 is in the low resistance state, it is determined that the data written to the memory cell MC22 is "1". Furthermore, when the nonvolatile storage element R22 is in the high resistance state, it is determined that the data written to the memory cell MC22 is "0".

The details of the control procedure in the read mode are shown in (a) and (b) of FIG. 16. The nonvolatile storage element according to Embodiment 4 differs from the 1T1R nonvolatile storage element according to Embodiment 3 only in that the word line driver 405 transmits a signal indicating one of (i) the current value $I_{READ}$ of a current that flows to the nonvolatile storage element and (ii) the resistance value $R_{READ}$ of the nonvolatile storage element. The other processing (detecting, determining, etc.) of the control unit 403 in the read mode is the same as that of the control unit 303 according to Embodiment 3.

Although a bit line is grounded and a predetermined voltage pulse is applied to a word line in the description above, voltage pulses different from each other may be applied to the bit line and the word line so that the potential difference becomes a predetermined voltage.

Although the control unit 403 performs the detecting and the determining in the read mode according to Embodiment 4, the sense amplifier included in the word line driver 405 or a sense amplifier independently provided may perform the detecting or both the detecting and the determining instead of the control unit 403, In other words, the control unit 403 and the sense amplifier may appropriately share processing for the detecting and the determining.

Since the method for reading data and the nonvolatile storage device according to the present invention are described based on Embodiments 1 to 4, the present invention is not limited to these Embodiments. Various modifications which can be conceived by those skilled in the art without materially departing from the novel teachings and advantages of the present invention are intended to be included within the scope of the present invention.

Although Embodiments 1 to 4 describe determining a resistance state of a nonvolatile storage element, based on a current value of a current that flows through the nonvolatile storage element with application of a fixed voltage or based on a resistance value of the nonvolatile storage element, the present invention is not limited to the determination method based on such information.

For example, the resistance state of the nonvolatile storage element may be determined based on a voltage (that is, voltage drop) in the nonvolatile storage element with application of a fixed current, or based on the time constant defined by the nonvolatile storage element and a capacitor of a fixed capacitance (or a counter value indicating a time corresponding to the time constant). In any of the methods, the advantages of the present invention can be produced by setting the reference level to be referenced in determining a resistance state of the nonvolatile storage element to a value closer to a physical value of the nonvolatile storage element in the low resistance state than a median value between the physical value of the nonvolatile storage element in the low resistance state and a physical value of the nonvolatile storage element in the high resistance state.

INDUSTRIAL APPLICABILITY

The present invention is applicable to nonvolatile storage elements used in, particularly, various electronic devices, such as digital home appliances, memory cards, mobile phones, and personal computers, as a method for reading data from a variable resistance nonvolatile storage element whose resistance value changes according to an electric signal to be applied, and as the nonvolatile storage device.

REFERENCE SIGNS LIST 100, 201, R11 to R33, R311 to R322 Variable resistance nonvolatile storage element
101 Substrate
102 Oxide layer
103 Lower electrode
104 First transition metal oxide layer (first oxygen-deficient tantalum oxide layer, first oxygen-deficient hafnium oxide layer, first oxygen-deficient zirconium oxide layer, etc.)

105 Second transition metal oxide layer (second tantalum oxide layer, second hafnium oxide layer, second zirconium oxide layer, titanium oxide layer, etc.)
106 Variable resistance layer
107 Upper electrode
202 Load resistor
203 Terminal
204 Terminal
300, 400 Nonvolatile storage device
301, 401 Memory cell array
302, 402 Address buffer
303, 403 Control unit
304, 404 Row decoder
305, 405 Word line driver
306, 406 Column decoder
307 Bit line/plate line driver
407 Bit line driver
MC11 to MC33, MC311 to MC322 Memory cell
T311 to T322 Selection transistor
D11 to D33 Current steering element

The invention claimed is:

1. A method for reading data from a variable resistance nonvolatile storage element (i) including a first electrode, a second electrode, and a variable resistance layer disposed between and in contact with the first electrode and the second electrode and (ii) having characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, the nonvolatile storage element being an element having fluctuations that are characteristics in which a resistance value of the nonvolatile storage element in the second resistance state RH randomly changes with passage of time, the method comprising:
   detecting a current that flows through the nonvolatile storage element with application of a fixed voltage; and
   determining that (i) the nonvolatile storage element is in a high resistance state when the current detected in the detecting is smaller than a current reference level Iref, and (ii) the nonvolatile storage element is in a low resistance state when the current detected in the detecting is larger than the reference level Iref, the current reference level Iref being defined by (IRL+IRH)/2<Iref<IRL, where IRL denotes a current that flows through the nonvolatile storage element in the first resistance state RL with application of the fixed voltage, IRH denotes a current that flows through the nonvolatile storage element in the second resistance state RH, and IRH<IRL.

2. The method according to claim 1,
wherein in the determining, a current value larger than an average value of the fluctuations by at least 4σ is determined as the current reference level Iref satisfying (IRL+IRH)/2<Iref<IRL, where σ denotes a standard deviation in the fluctuations of the current value IRH of the nonvolatile storage element in the second resistance state RH.

3. The method according to claim 1,
wherein the variable resistance layer has a stacked structure including (i) a first transition metal oxide comprising a first transition metal and (ii) a second transition metal oxide comprising a second transition metal, the first transition metal oxide being higher in oxygen deficiency than the second transition metal oxide.

4. The method according to claim 3,
wherein the second transition metal oxide is larger in resistance value than the first transition metal oxide.

5. The method according to claim 3,
wherein the first transition metal oxide is identical to the second transition metal oxide.

6. The method according to claim 5,
wherein the first transition metal oxide and the second transition metal oxide comprise tantalum.

7. The method according to claim 3,
wherein the first transition metal oxide is different from the second transition metal oxide, and
the second transition metal oxide is lower in standard electrode potential than the first transition metal oxide.

8. A nonvolatile storage device, comprising:
a variable resistance nonvolatile storage element; and
a control unit configured to read data from the nonvolatile storage element,
   wherein the nonvolatile storage element (i) includes a first electrode, a second electrode, and a variable resistance layer disposed between and in contact with the first electrode and the second electrode and (ii) has characteristics in which a resistance state between the first electrode and the second electrode with application of a voltage having a first polarity between the first electrode and the second electrode becomes a first resistance state RL, and in which the resistance state between the first electrode and the second electrode with application of a voltage having a second polarity different from the first polarity between the first electrode and the second electrode becomes a second resistance state RH, the second resistance state RH> the first resistance state RL, the nonvolatile storage element being an element having fluctuations that are characteristics in which a resistance value of the nonvolatile storage element in the second resistance state RH randomly changes with passage of time, and
the control unit is configured to:
detect a current that flows through the nonvolatile storage element with application of a fixed voltage; and
determine that (i) the nonvolatile storage element is in a high resistance state when the detected current is smaller than a current reference level Iref, and (ii) the nonvolatile storage element is in a low resistance state when the detected current is larger than the reference level Iref, the current reference level Iref being defined by (IRL+IRH)/2<Iref<IRL, where IRL denotes a current that flows through the nonvolatile storage element in the first resistance state RL with application of the fixed voltage, IRH denotes a current that flows through the nonvolatile storage element in the second resistance state RH, and IRH<IRL.

9. The nonvolatile storage device according to claim 8,
wherein the control unit is configured to determine a current value larger than an average value of the fluctuations by at least 4σ as the current reference level Iref satisfying (IRL+IRH)/2<Iref<IRL, where σ denotes a standard deviation in the fluctuations of the current value IRH of the nonvolatile storage element in the second resistance state RH.

10. The nonvolatile storage device according to claim 8,
wherein the variable resistance layer has a stacked structure including (i) a first transition metal oxide comprising a first transition metal and (ii) a second transition metal oxide comprising a second transition metal, the first transition metal oxide being higher in oxygen deficiency than the second transition metal oxide.

11. The nonvolatile storage device according to claim 10, wherein the second transition metal oxide is larger in resistance value than the first transition metal oxide.

12. The nonvolatile storage device according to claim 10, wherein the first transition metal oxide is identical to the second transition metal oxide.

13. The nonvolatile storage device according to claim 12, wherein the first transition metal oxide and the second transition metal oxide comprise tantalum.

14. The nonvolatile storage device according to claim 10, wherein the first transition metal oxide is different from the second transition metal oxide, and the second transition metal oxide is lower in standard electrode potential than the first transition metal oxide.

15. The method according to claim 1, wherein the nonvolatile storage element has fluctuations that are characteristics in which a resistance value of the nonvolatile storage element in the first resistance state RL randomly changes with passage of time; and the nonvolatile storage element in the second resistance state RH has the fluctuations in resistance value larger than the fluctuations of the nonvolatile storage element in the first resistance state RL.

16. The nonvolatile storage device according to claim 8, wherein the nonvolatile storage element has fluctuations that are characteristics in which a resistance value of the nonvolatile storage element in the first resistance state RL randomly changes with passage of time; and the nonvolatile storage element in the second resistance state RH has the fluctuations in resistance value larger than the fluctuations of the nonvolatile storage element in the first resistance state RL.

* * * * *